(12) United States Patent
Lim et al.

(10) Patent No.: US 10,325,922 B2
(45) Date of Patent: Jun. 18, 2019

(54) SEMICONDUCTOR DEVICE INCLUDING INSULATING LAYERS AND METHOD OF FORMING THE SAME

(71) Applicants: Yeong Dae Lim, Suwon-si (KR); Seung Jae Jung, Suwon-si (KR); Jin Young Bang, Hwaseong-si (KR); Il Woo Kim, Gyeonggi-do (KR); Ho Gil Jung, Hwaseong-si (KR)

(72) Inventors: Yeong Dae Lim, Suwon-si (KR); Seung Jae Jung, Suwon-si (KR); Jin Young Bang, Hwaseong-si (KR); Il Woo Kim, Gyeonggi-do (KR); Ho Gil Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

(21) Appl. No.: 15/816,638

(22) Filed: Nov. 17, 2017

(65) Prior Publication Data
US 2018/0350830 A1 Dec. 6, 2018

(30) Foreign Application Priority Data

May 31, 2017 (KR) .................. 10-2017-0067360

(51) Int. Cl.
*H01L 27/11568* (2017.01)
*H01L 21/02* (2006.01)
(Continued)

(52) U.S. Cl.
CPC .. *H01L 27/11582* (2013.01); *H01L 27/11568* (2013.01); *H01L 29/0657* (2013.01);
(Continued)

(58) Field of Classification Search
None
See application file for complete search history.

(56) References Cited

U.S. PATENT DOCUMENTS 6,383,949 B1 5/2002 Kim et al.
8,557,695 B2 10/2013 Mizukami et al.
(Continued)

FOREIGN PATENT DOCUMENTS

JP 11-87310 A2 3/1999
JP 2002-43437 A2 2/2002
(Continued)

OTHER PUBLICATIONS

G. Gulleri et al., "Deposition temperature determination of HDPCVD silicon dioxide films," Microelectronic Engineering 82 (2005), pp. 236-241.

*Primary Examiner* — Herve-Louis Y Assouman
(74) *Attorney, Agent, or Firm* — Volentine, Whitt & Francos, PLLC

(57) ABSTRACT

A semiconductor device includes a substrate, a stacked structure of insulating layers and gate electrodes alternately and repeatedly stacked on the substrate, and a pillar passing through the stacked-layer structure. The insulating layers include lower insulating layers, intermediate insulating layers disposed on the lower insulating layers, and upper insulating layers disposed on the intermediate insulating layers. The lower insulating layers have a hardness less than that of the intermediate insulating layers, and the upper insulating layers have a hardness greater than that of the intermediate insulating layers.

20 Claims, 17 Drawing Sheets

(51) Int. Cl.
  *H01L 29/06* (2006.01)
  *H01L 27/11582* (2017.01)
  *H01L 29/10* (2006.01)
  *H01L 27/11565* (2017.01)
  *H01L 21/28* (2006.01)
  *H01L 21/311* (2006.01)

(52) U.S. Cl.
  CPC ...... *H01L 29/1037* (2013.01); *H01L 21/0217* (2013.01); *H01L 21/0228* (2013.01); *H01L 21/02211* (2013.01); *H01L 21/02271* (2013.01); *H01L 21/02532* (2013.01); *H01L 21/02595* (2013.01); *H01L 21/02636* (2013.01); *H01L 21/28282* (2013.01); *H01L 21/31111* (2013.01); *H01L 27/11565* (2013.01)

(56) References Cited

U.S. PATENT DOCUMENTS

| | | | |
|---|---|---|---|
| 9,087,789 B2 | 7/2015 | Cho et al. | |
| 9,093,500 B2 | 7/2015 | Park et al. | |
| 9,412,617 B2 | 8/2016 | Narishige et al. | |
| 9,418,863 B2 | 8/2016 | Hirotsu et al. | |
| 9,449,821 B2 | 9/2016 | Yang et al. | |
| 2008/0079089 A1* | 4/2008 | Lee ................ | H01L 29/66515 257/384 |
| 2011/0085377 A1* | 4/2011 | Mizukami ............... | G11C 5/02 365/184 |
| 2012/0211821 A1 | 8/2012 | Matsumoto | |
| 2016/0314986 A1 | 10/2016 | Tominaga et al. | |
| 2016/0322230 A1 | 11/2016 | Shimoda et al. | |

FOREIGN PATENT DOCUMENTS

| | | |
|---|---|---|
| JP | 4025542 B2 | 12/2007 |
| JP | 2011-249583 A2 | 12/2011 |
| JP | 2012-174961 A | 9/2012 |
| KR | 10-2004-0055464 A | 6/2004 |
| KR | 10-2016-0055744 A | 5/2016 |

* cited by examiner

SEMICONDUCTOR DEVICE INCLUDING INSULATING LAYERS AND METHOD OF FORMING THE SAME

PRIORITY STATEMENT

This U.S. non-provisional patent application claims priority under 35 U.S.C. § 119 to and the benefit of Korean patent application No. 10-2017-0067360, filed on May 31, 20017, in the Korean Intellectual Property Office (KIPO), the disclosure of which is hereby incorporated by reference in its entirety.

BACKGROUND

1. Field

The inventive concept relates to a semiconductor device, which has a structure in which a plurality of insulating layers are stacked and pillars passing through the structure, and to a method of forming the same.

2. Discussion of Related Art

In order to increase the degree of integration of a semiconductor device in accordance with the miniaturization of electronic devices, techniques for vertically stacking a plurality of layers and forming pillars passing through the plurality of layers have been attempted. The pillars are formed in holes vertically passing through the plurality of layers. Each of the holes has a high aspect ratio. The degree of difficulty of a patterning process of forming the holes is gradually increasing. For example, holes having a high aspect ratio are not completely formed to desired depths by current etch processes and tend to be susceptible to defects such as bending, reduction in diameter toward the bottom of the hole, and/or striation degradation.

SUMMARY

According to an example of the present inventive concept, there is provided a semiconductor device including a substrate, a stacked-layer structure having insulating layers and gate electrodes with the insulting layers being alternately stacked with the gate electrodes on the substrate, and a pillar passing through the stacked-layer structure. The insulating layers include a plurality of lower insulating layers, a plurality of intermediate insulating layers on the lower insulating layers, and a plurality of upper insulating layers on the plurality of intermediate insulating layers. The plurality of lower insulating layers has a hardness lower than that of the plurality of intermediate insulating layers, and the plurality of upper insulating layers has a hardness higher than that of the plurality of intermediate insulating layers.

According to another example of the present inventive concept, there is provided a semiconductor device including a substrate in a cell region and a connection region of the device, a stacked-layer structure in the cell region and having insulating layers and gate electrodes with the insulting layers being alternately stacked with the gate electrodes on the substrate, an insulating interlayer in the connection region and covering the stacked-layer structure in the connection region, a cell pillar passing through the stacked-layer structure in the cell region, and a dummy pillar passing through the insulating interlayer and the stacked-layer structure in the connection region. The insulating layers include a plurality of lower insulating layers, a plurality of intermediate insulating layers on the plurality of lower insulating layers, and a plurality of upper insulating layers on the plurality of intermediate insulating layers. The plurality of lower insulating layers have a hardness lower than that of the plurality of intermediate insulating layers, and the plurality of upper insulating layers have a hardness higher than that of the plurality of intermediate insulating layers.

According to yet another example of the present inventive concept, there is provided a semiconductor device including a substrate, stacked-layer structure having insulating layers and gate electrodes with the insulting layers being alternately stacked with the gate electrodes on the substrate, and a pillar passing through the stacked-layer structure. The insulating layers include a plurality of lower insulating layers, a plurality of shape control insulating layers on the plurality of lower insulating layers, and a plurality of upper insulating layers on the plurality of shape control insulating layers. The plurality of shape control insulating layers has a hardness lower than that of the plurality of upper insulating layers. Also, the plurality of shape control insulating layers occupies a region of the device within a range of 0.3 times to 0.7 times a height of the stacked-layer structure.

BRIEF DESCRIPTION OF THE DRAWINGS

The above and other objects, features and advantages of the inventive concept will become more apparent to those of ordinary skill in the art from the following description of examples thereof made in detail with reference to the accompanying drawings, in which.

DETAILED DESCRIPTION

A semiconductor device according to the present inventive concept may be embodied as a flash memory such as a vertical NAND (VNAND) memory or a three-dimensional NAND (3D-NAND) memory.

Figure 1:
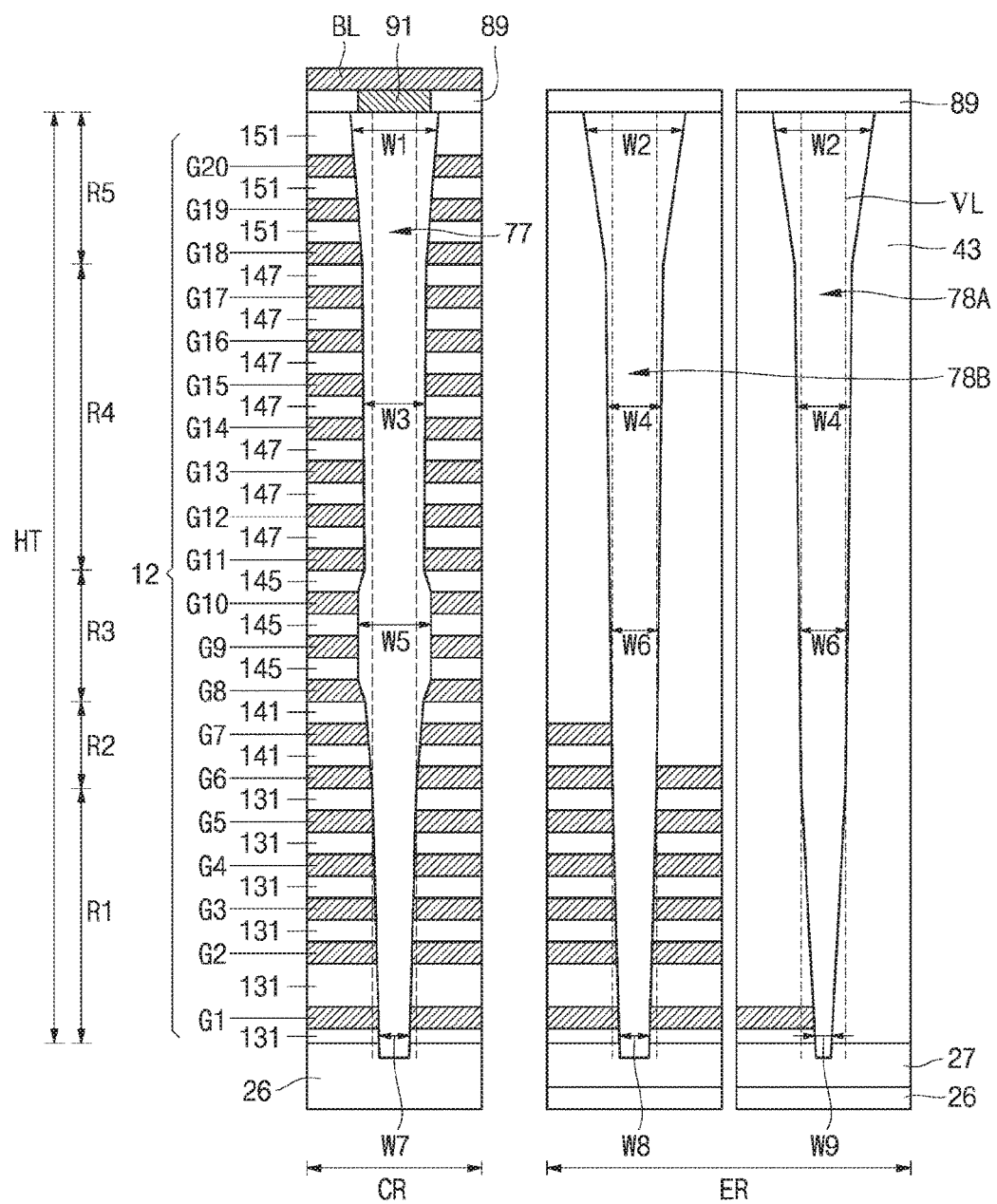
FIGS. 1, 2, 3 and 4 are cross-sectional of examples of semiconductor devices according to the present inventive concept.

Referring to FIG. 1, in an example of the present inventive concept, the semiconductor device may include a cell region CR and a connection region ER in which a stacked-layer structure 12, a device isolation layer 27, an insulating interlayer 43, a cell pillar 77, dummy pillars 78A and 78B, a capping layer 89, a bit plug 91, and a bit line BL, are formed on a substrate 26. The stacked-layer structure 12 may include insulating layers 131, 141, 145, 147, and 151 and gate electrodes G1 to G20, which are alternately and repeatedly stacked. The insulating layers 131, 141, 145, 147, and 151 may include a plurality of lower insulating layers 131, a plurality of first intermediate insulating layers 141, a plurality of striation control insulating layers 145, a plurality of second intermediate insulating layers 147, and a plurality of upper insulating layers 151. Dashed lines shown in FIG. 1 are lines VL perpendicular to a surface of the substrate 26 so that relative sizes of components are easily understood. In an example of the present inventive concept, the plurality of striation control insulating layers 145 may correspond to a plurality of shape control insulating layers.

The stacked-layer structure 12 may be formed in the cell region CR and extend into the connection region ER. In the connection region ER, the insulating layers 131, 141, 145, 147, and 151 and the gate electrodes G1 to G20 may have a cascade structure. The insulating interlayer 43 may cover a portion of the stacked-layer structure 12 which extends into the connection region ER. The connection region ER may also refer to a pad region of the semiconductor device.

A first region R1, a second region R2 disposed on the first region R1, a third region R3 disposed on the second region R2, a fourth region R4 disposed on the third region R3, and a fifth region R5 disposed on the fourth region R4 may be defined between the bottom and top of the stacked-layer structure 12. The stacked-layer structure 12 may have a first height HT. The height HT of the stacked-layer structure 12 may be the distance from the lower surface of the bottom-most one of the lower insulating layers 131 (bottom of the first region R1) to an upper surface of the uppermost one of the upper insulating layers 151 (top of the fifth region R5) of the stacked-layer structure 12.

The lower insulating layers 131 may be formed in the first region R1, the first intermediate insulating layers 141 may be formed in the second region R2, the striation control insulating layers 145 may be formed in the third region R3, the second intermediate insulating layers 147 may be formed in the fourth region R4, and the upper insulating layers 151 may be formed in the fifth region R5. The uppermost surface of the plurality of lower insulating layers 131 may be situated at a level in a range of 0.3 times to 0.4 times of the first height HT from the bottom of the stacked structure 12 coinciding with the upper surface of the substrate 26 in this example. The lowermost surface of the plurality of the upper insulating layers 151 may be situated at a level in a range of 0.5 times to 0.9 times the first height HT from the bottom of the stacked structure 12 or upper surface of the substrate 26 in this example. The plurality of striation control insulating layers 145 may occupy a region ranging from 0.3 times to 0.7 times the first height HT from the bottom of the stacked structure 12 or upper surface of the substrate 26.

The lower insulating layers 131 may be of material having a hardness less than the hardness of the first intermediate insulating layers 141 and the second intermediate insulating layers 147. The upper insulating layers 151 may be of material having a hardness greater than the hardness of the first intermediate insulating layers 141 and the second intermediate insulating layers 147. The striation control insulating layers 145 may be of material having a hardness less than the hardness of the first intermediate insulating layers 141 and the second intermediate insulating layers 147. In an example of the present inventive concept, the striation control insulating layers 145 are of material having a hardness lower than the hardness of the lower insulating layers 131.

In these respects, the lower insulating layers 131 may have substantially the same hardness as one another and this may be referred to as the "hardness" of the (plurality of) lower insulating layers 131. The same goes for any another group of insulating layers designated by the same reference numeral. For example, the striation control insulating layers 145 may have substantially the same hardness as one another and this may be referred to as the "hardness" of the (plurality of) striation control insulating layers 145.

In an example of the present inventive concept, the lower insulating layers 131, the first intermediate insulating layers 141, the striation control insulating layers 145, the second intermediate insulating layers 147, and the upper insulating layers 151 may include silicon oxide. The lower insulating layers 131 may have a hardness which is 1% to 15% lower than that of the first and second intermediate insulating layers 141 and 147, the striation control insulating layers 145 may have a hardness which is 1% to 15% lower than that of the first and second intermediate insulating layers 141 and 147, and the upper insulating layers 151 may have a hardness which is 1% to 15% higher than that of the first and second intermediate insulating layers 141 and 147.

In an example of the present inventive concept, the striation control insulating layers 145 may be formed between the lower insulating layers 131 and the first intermediate insulating layers 141. In another example, the first intermediate insulating layers 141 are omitted.

In an example of the present inventive concept, the striation control insulating layers 145 may be formed between the second intermediate insulating layers 147 and the upper insulating layers 151. In another example, the second intermediate insulating layers 147 are omitted.

In the fifth region R5, the cell pillar 77 may have an upper portion which passes through the upper insulating layers 151. The cell pillar 77 may have a width which increases in the upper portion thereof in a direction away from the substrate 26 (i.e., in an upward direction). An upper end of the cell pillar 77 may have a first width W1. The dummy pillars 78A and 78B may have respective upper portions which pass through the insulating interlayer 43 at substantially the same horizontal level as the fifth region R5. Here, and in the description that follows, the term "substantially the same horizontal level" as a particular region will refer to a region in the device bounded by and between upper and lower horizontal planes substantially coinciding with the uppermost and lowermost bounds of the particular region. Each of the dummy pillars 78A and 78B may have a width which increases in the upper portion thereof. An upper end of each of the dummy pillars 78A and 78B may have a second width W2. The first width W1 may be smaller than the second width W2. An angle subtended by a side surface of the upper portion of the cell pillar 77 and a first line VL perpendicular to the upper surface of the substrate 26 may be smaller than respective angles subtended by side surfaces of the upper portions of the dummy pillars 78A and 78B and second lines VL perpendicular to the upper surface of the substrate 26. For reference with respect to these angles, the side surface of the upper region of the cell pillar 77 may intersect the first line VL at substantially the same horizontal level in the device as that at which the side surface of the dummy pillar 78A (or dummy pillar 78B) intersects a second line VL (although for ease of illustration the vertical lines VL are shown as dashed lines in FIG. 1 spaced slightly from locations at the horizontal level where they may intersect the side surfaces of the upper regions of the pillars 77, 78A and 78B).

In an example of the present inventive concept, the first width W1 may be different from the second width W2. The second width W2 may be smaller than the first width W1.

In the fourth region R4, the cell pillar 77 may pass through the second intermediate insulating layers 147. The cell pillar 77 may have a third width W3 at substantially the same horizontal level as the fourth region R4. Each of the dummy pillars 78A and 78B may have a fourth width W4 in the fourth region R4.

In the third region R3, the cell pillar 77 may pass through the striation control insulating layers 145. The cell pillar 77 may have a fifth width W5 in the third region R3. Each of the dummy pillars 78A and 78B may have a sixth width W6 at substantially the same horizontal level as the third region R3. The fifth width W5 may be greater than the sixth width W6. In an example of the present inventive concept, the fifth width W5 may be greater than the third width W3.

In the first region R1, the cell pillar 77 may have a lower end which passes through the lower insulating layers 131. The cell pillar 77 may have a width which decreases in the lower portion thereof in a direction towards the substrate 26 (i.e., in a downward direction). A lower end of the cell pillar 77 may have a seventh width W7. The dummy pillars 78A and 78B may include a first dummy pillar 78A formed on an edge of the stacked-layer structure 12 and a second dummy pillar 78B formed between the cell pillar 77 and the first dummy pillar 78A. The second dummy pillar 78B may have a lower portion which passes through the lower insulating layers 131 at substantially the same horizontal level as the first region R1. The second dummy pillar 78B may have a width which decreases in the lower portion thereof in the direction towards the substrate 26. A lower end of the second dummy pillar 78B may have an eighth width W8. The eighth width W8 may be substantially the same as the seventh width W7. The first dummy pillar 78A may have a lower portion which passes through parts of the insulating interlayer 43 and the lower insulating layers 131 at substantially the same horizontal level as the first region R1. The first dummy pillar 78A may have a width which decreases in the lower portion thereof in the direction towards the substrate. A lower end of the first dummy pillar 78A may have a ninth width W9. The ninth width W9 may be smaller than the seventh width W7. An angle subtended by the side surface of the lower portion of the cell pillar 77 and the line VL perpendicular to the surface of the substrate 26 may be smaller than an angle subtended by a side surface of the lower portion of the first dummy pillar 78A and the line VL perpendicular to the surface of the substrate 26.

Figure 2:
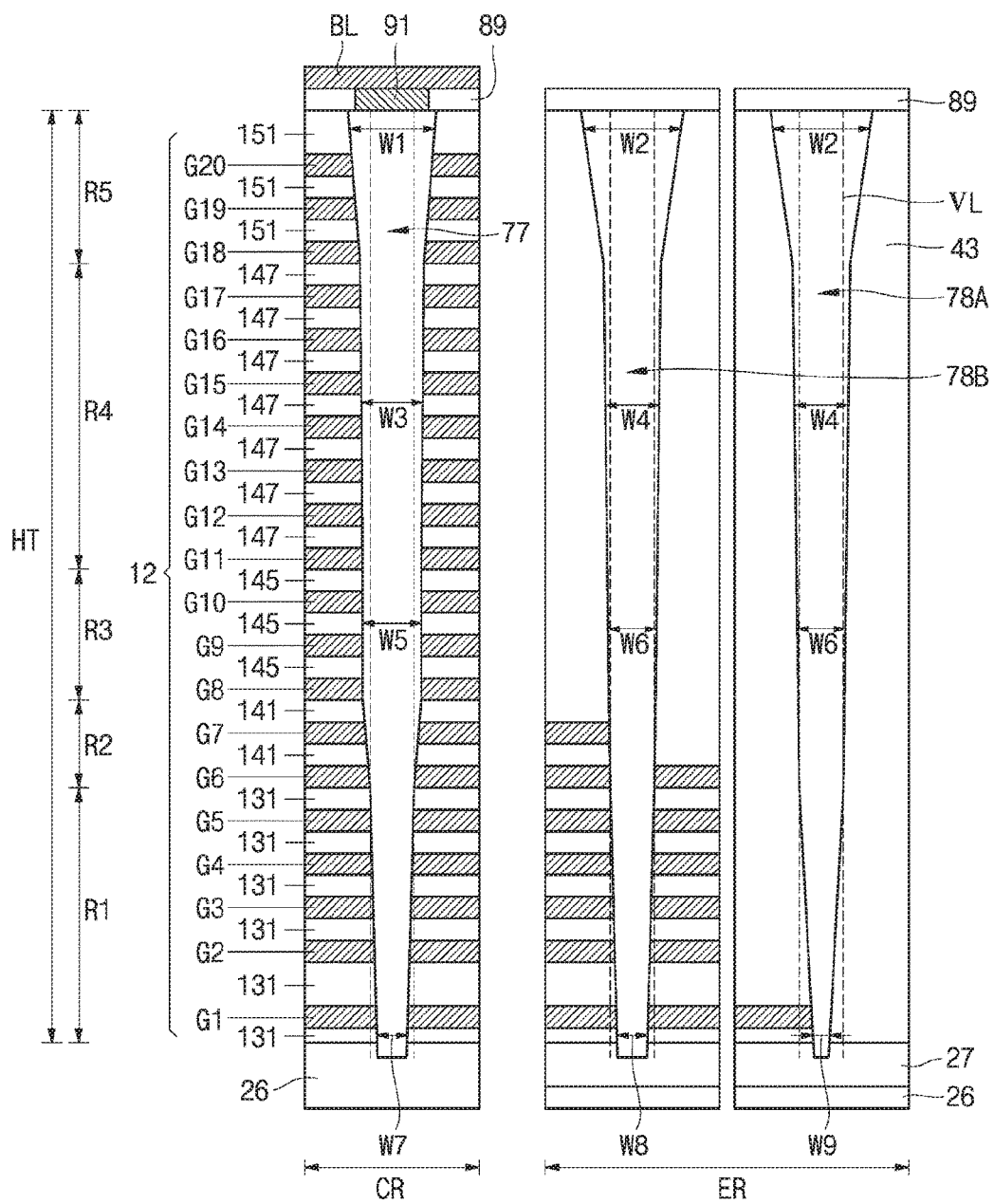

Referring to the example shown in FIG. 2, the fifth width W5 of the cell pillar 77 may be smaller than or equal to the third width W3 of the cell pillar 77.

Figure 3:
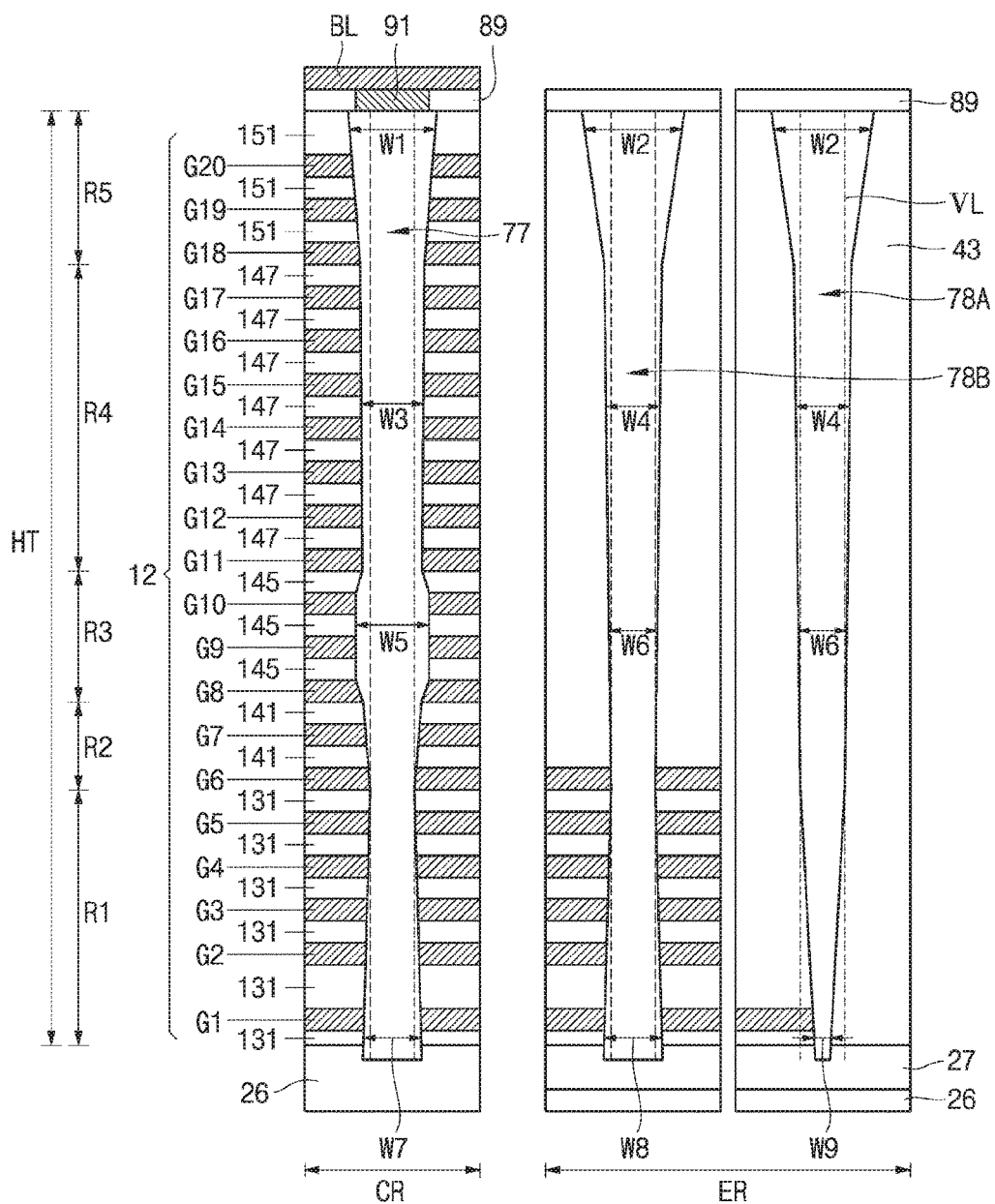

Referring to the example shown in FIG. 3, in the first region R1, the cell pillar 77 may have a width which increases in the lower portion thereof in the direction towards the substrate 26. The second dummy pillar 78B may have a width which increases in the lower portion thereof, in the direction towards the substrate 26, at substantially the same horizontal level as the first region R1. The first dummy pillar 78A may have a width which decreases in the lower portion thereof, in the direction towards the substrate 26, at substantially the same horizontal level as the first region R1. The ninth width W9 of the first dummy pillar 78A may be smaller than the seventh width W7 of the cell pillar 77.

Figure 4:
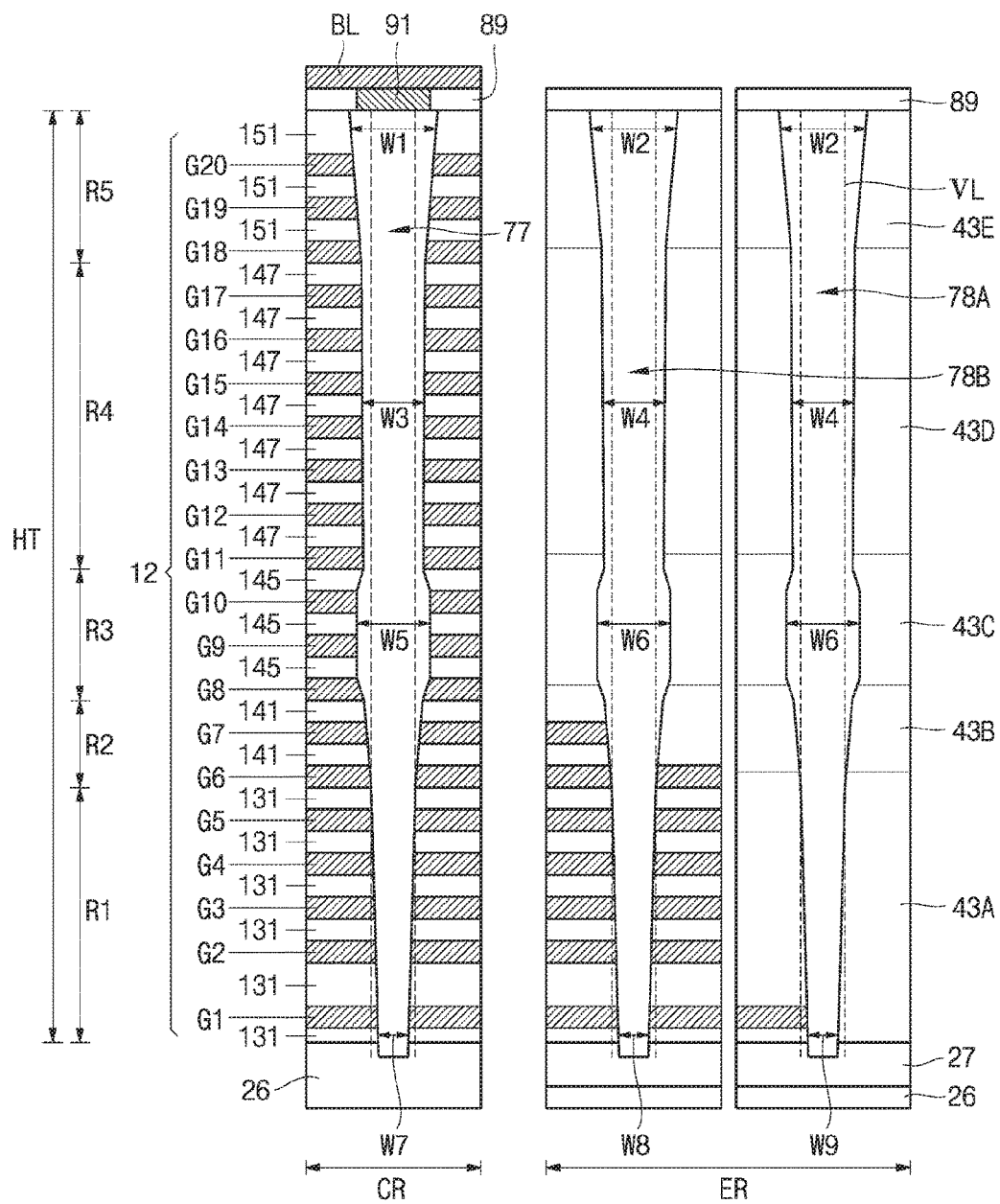

Referring to the example shown in FIG. 4, the semiconductor device may have a cell region CR and a connection region ER and include a stacked-layer structure 12, a device isolation layer 27, the insulating interlayer includes interlayer insulating layers 43A, 43B, 43C, 43D, and 43E, a cell pillar 77, dummy pillars 78A and 78B, a capping layer 89, a bit plug 91, and a bit line BL, formed on a substrate 26 in the cell region CR and a connection region ER.

The insulating interlayer may include a first interlayer insulating layer 43A formed at substantially the same horizontal level as the first region R1 and having substantially the same hardness as the lower insulating layers 131, a second interlayer insulating layer 43B formed at substantially the same horizontal level as the second region R2 and having substantially the same hardness as the first intermediate insulating layers 141, a third interlayer insulating layer 43C formed at substantially the same horizontal level as the third region R3 and having substantially the same hardness as the striation control insulating layers 145, a fourth interlayer insulating layer 43D formed at substantially the same horizontal level as the fourth region R4 and having substantially the same hardness as the second intermediate insulating layers 147, and a fifth interlayer insulating layer 43E formed at substantially the same horizontal level as the fifth region R5 and having substantially the same hardness as the upper insulating layers 151. Each of the interlayer insulating layer 43A, 43B, 43C, 43D, and 43E may include silicon oxide.

The first width W1 of the cell pillar 77 may be substantially the same as the second width W2 of each of the dummy pillars 78A and 78B. The fifth width W5 of the cell pillar 77 may be substantially the same as the sixth width W6 of each of the dummy pillars 78A and 78B. The seventh width W7 of the cell pillar 77 may be substantially the same as the eighth width W8 of the second dummy pillar 78B and the ninth width W9 of the first dummy pillar 78A.

Figure 5:
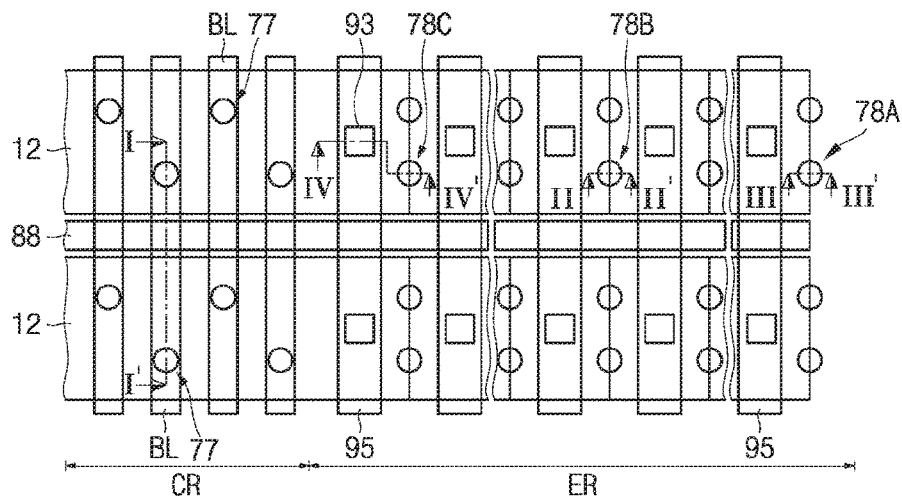
FIG. 5 is a layout of examples of the semiconductor devices according to the present inventive concept.
Figure 6:
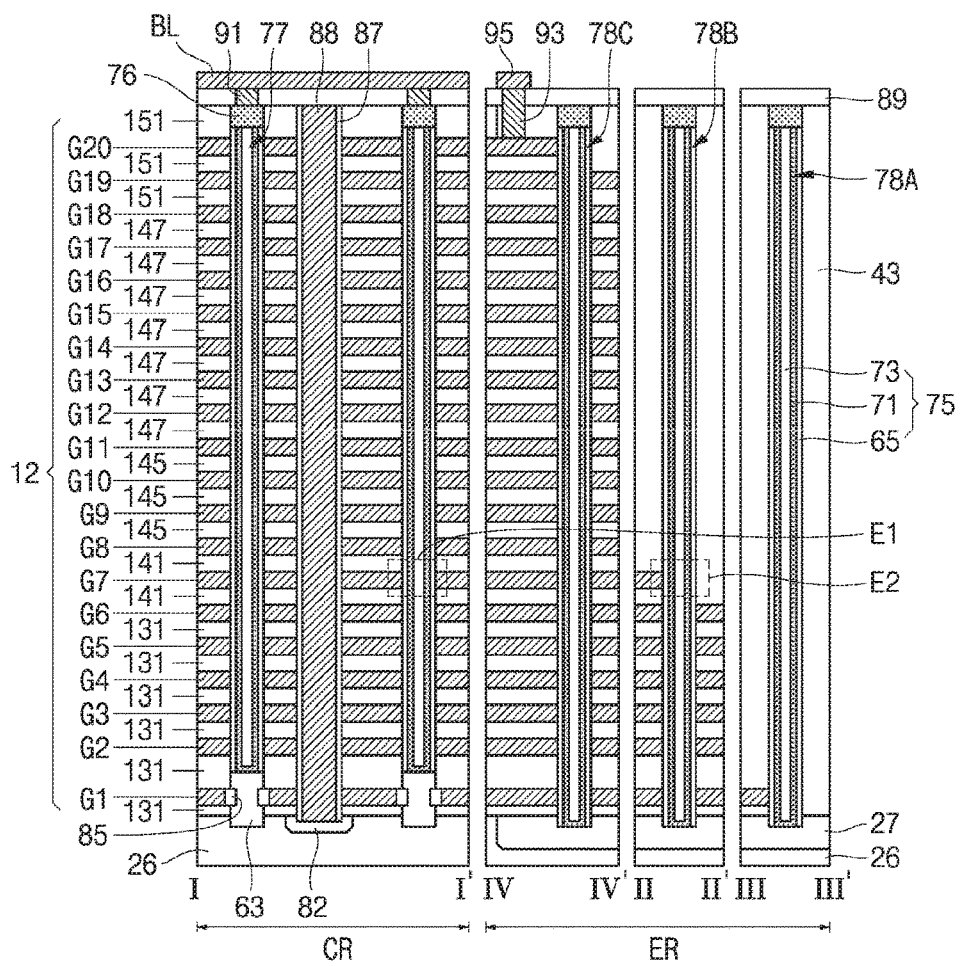
FIG. 6 is a cross-sectional view of a the semiconductor device according to the present inventive concept taken along lines I-I', II-II', III-III', and IV-IV' of FIG. 5.

Referring to FIGS. 5 and 6, in an example of the present inventive concept, the semiconductor device may have a cell region CR and a connection region ER, and include a stacked-layer structures 12, a device isolation layer 27, an insulating interlayer 43, cell pillars 77, dummy pillars 78A, 78B, and 78C, an impurity region 82, a gate insulating layer 85, a spacer 87, a source line 88, a capping layer 89, a bit plug 91, a bit line BL, an interconnection plug 93, and a metal line 95, which are formed on a substrate 26 in the cell region CR and connection region ER.

Each of the stacked-layer structures 12 may include insulating layers 131, 141, 145, 147, and 151 and gate electrodes G1 to G20, which are alternately and repeatedly stacked. The insulating layers 131, 141, 145, 147, and 151 may include lower insulating layers 131, first intermediate insulating layers 141, striation control insulating layers 145, second intermediate insulating layers 147, and upper insulating layers 151. In an example of the present inventive concept, a first gate electrode G1 may correspond to a ground selection line or a source selection line, second to nineteenth gate electrodes G2 to G19 may correspond to word lines, and a $20^{th}$ gate electrode G20 may correspond to a string selection line or a drain selection line. Some of the gate electrodes G1 to G20 may correspond to dummy word lines. A stacked layer including the insulating layers 131, 141, 145, 147, and 151 and the gate electrodes G1 to G20 is shown as an example for a brief explanation, and each of the stacked-layer structures 12 may include a stacked layer including a greater number of insulating layers and gate electrodes.

Each of the cell pillars 77 may include a semiconductor pattern 63, a channel structure 75, and a conductive pad 76. Each of the dummy pillars 78A, 78B, and 78C may include the channel structure 75 and the conductive pad 76. The channel structure 75 may include a data storage pattern 65, a channel pattern 71, and a core pattern 73. Each of the cell pillars 77 and the dummy pillars 78A, 78B, and 78C may have a configuration similar to any of those described with reference to FIGS. 1 to 4.

Figure 7:
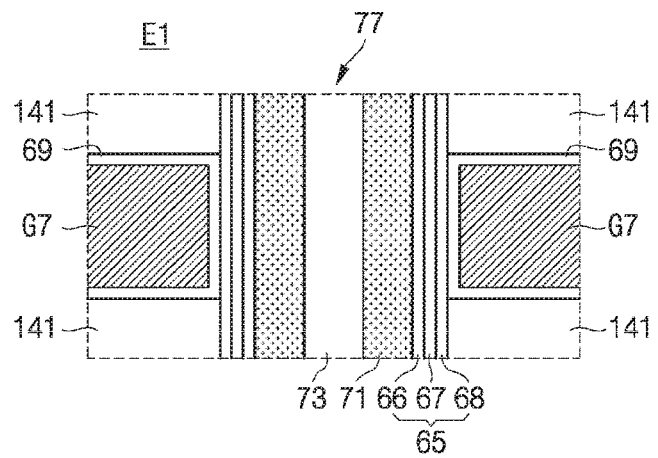
FIGS. 7, 8 and 9 are partially enlarged views of examples of parts of the device shown in FIG. 6.

Referring to FIG. 7, in a first region E1 of FIG. 6, the cell pillar 77 may include a core pattern 73, a channel pattern 71 surrounding a side surface of the core pattern 73, and a data storage pattern 65 surrounding an outer side of the channel pattern 71. The data storage pattern 65 may include a tunnel insulating layer 66, a charge storage layer 67, and a first blocking layer 68. A seventh gate electrode G7 may be formed between first intermediate insulating layers 141. The cell pillar 77 may vertically pass through the first intermediate insulating layers 141 and the seventh gate electrode G7. The tunnel insulating layer 66 may be formed between the channel pattern 71 and the charge storage layer 67. The first blocking layer 68 may be formed between the seventh gate electrode G7 and the charge storage layer 67. The charge storage layer 67 may be formed between the tunnel insulating layer 66 and the first blocking layer 68. A second blocking layer 69 may be interposed between the seventh gate electrode G7 and the first blocking layer 68 and configured to cover an upper surface and a lower surface of the seventh gate electrode G7.

Figure 8:
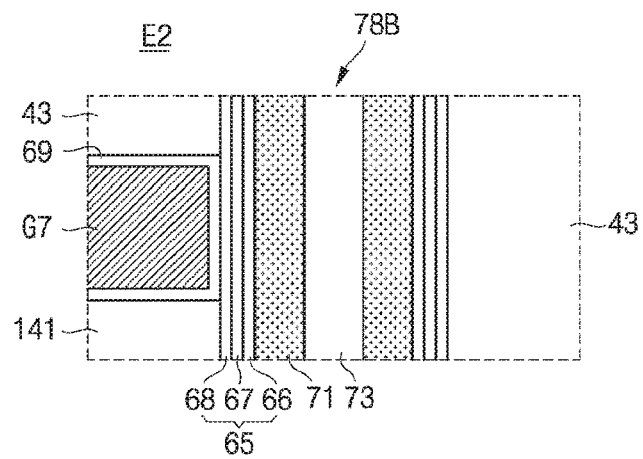

Referring to FIG. 8, in a second region E2 of FIG. 6, the second dummy pillar 78B may include a core pattern 73, a channel pattern 71, and a data storage pattern 65. One side surface of the second dummy pillar 78B may be in contact with the insulating interlayer 43. A first intermediate insulating layer 141, a seventh gate electrode G7, and the insulating interlayer 43 may be formed at one side of the second dummy pillar 78B. A second blocking layer 69 may be interposed between the seventh gate electrode G7 and the second dummy pillar 78B and configured to cover the upper surface and the lower surface of the seventh gate electrode G7.

In another example of the present inventive concept, the second blocking layer 69 is omitted.

Figure 9:
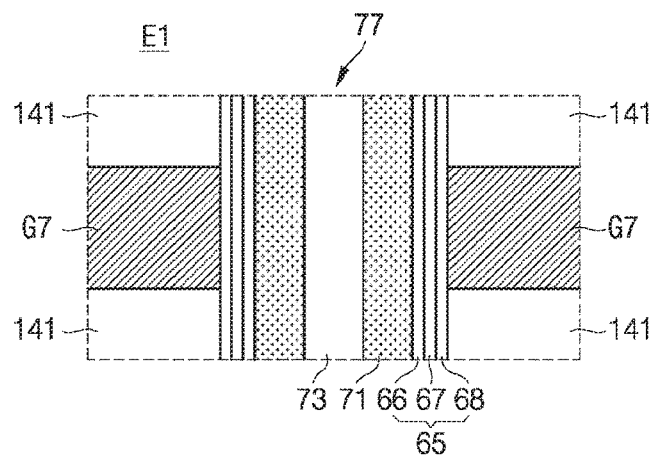

Referring to FIG. 9, in the first region E1 of FIG. 6, the cell pillar 77 may include a core pattern 73, a channel pattern 71, and a data storage pattern 65. The data storage pattern 65 may include a tunnel insulating layer 66, a charge storage layer 67, and a first blocking layer 68. The seventh gate electrode G7 may be formed between the first intermediate insulating layers 141. The cell pillar 77 may vertically pass through the first intermediate insulating layers 141 and the seventh gate electrode G7.

FIGS. 10 to 20 illustrate examples of a method of forming a semiconductor device, having layouts as shown in FIG. 5, according to the present inventive concept.

Figure 10:
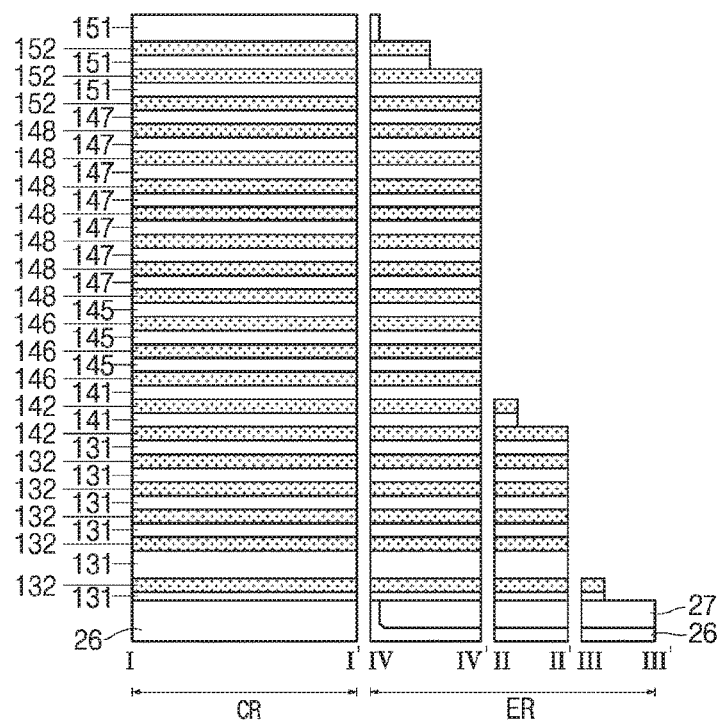
FIGS. 10-20 illustrate a semiconductor device having a layout illustrated in FIG. 5 during the course of examples of methods of manufacturing the same according to the present inventive concept, with FIGS. 10, 11 and 12 and 16, 17, 18, 19 and 20 being cross-sectional views taken in the direction of lines I-I', II-II', III-III', and IV-IV' of FIG. 5, and FIGS. 13, 14 and 15 being partially enlarged views of examples of parts of the device at the stage of manufacture illustrated in FIG. 12.

Referring to FIGS. 5 and 10, a device isolation layer 27, insulating layers 131, 141, 145, 147, and 151, and mold layers 132, 142, 146, 148, and 152 may be formed on the substrate 26 including in the cell region CR and the connection region ER. The insulating layers 131, 141, 145, 147, and 151 may include a plurality of lower insulating layers 131, a plurality of first intermediate insulating layers 141, a plurality of striation control insulating layers 145, a plurality of second intermediate insulating layers 147, and a plurality of upper insulating layers 151. The mold layers 132, 142, 146, 148, and 152 may include a plurality of lower mold layers 132, a plurality of first intermediate mold layers 142, a plurality of striation control mold layers 146, a plurality of second intermediate mold layers 148, and a plurality of upper mold layers 152. The insulating layers 131, 141, 145, 147, and 151 and the mold layers 132, 142, 146, 148, and 152 may be alternately and repeatedly stacked. In an example of the present inventive concept, the striation control insulating layers 145 may be shape control insulating layers. The striation control mold layers 146 may be shape control mold layers.

The substrate 26 may include a semiconductor substrate such as a silicon wafer or a silicon on insulator (SOI) wafer. For example, the substrate 26 may be a single crystalline silicon wafer including P-type impurities such as boron (B). The device isolation layer 27 may be formed in the substrate 26 in the connection region ER using a trench isolation technique. The device isolation layer 27 may include an insulating material such as silicon oxide, silicon nitride, silicon oxynitride, or a combination thereof. In an example of the present inventive concept, the device isolation layer 27 is a semiconductor layer including P-type impurities.

The lower insulating layers 131 and the lower mold layers 132 may be alternately and repeatedly stacked on the substrate 26. The first intermediate insulating layers 141 and the first intermediate mold layers 142 may be alternately and repeatedly stacked on the lower insulating layers 131 and the lower mold layers 132. The striation control insulating layers 145 and the striation control mold layers 146 may be alternately and repeatedly stacked on the first intermediate insulating layers 141 and the first intermediate mold layers 142. The second intermediate insulating layers 147 and the second intermediate mold layers 148 may be alternately and repeatedly stacked on the striation control insulating layers 145 and the striation control mold layers 146. The upper insulating layers 151 and the upper mold layers 152 may be alternately and repeatedly stacked on the second intermediate insulating layers 147 and the second intermediate mold layers 148.

The insulating layers 131, 141, 145, 147, and 151 and the mold layers 132, 142, 146, 148, and 152 may span the cell region CR and extend into the connection region ER. In the connection region ER, edges of the insulating layers 131, 141, 145, 147, and 151 and the mold layers 132, 142, 146, 148, and 152 may be patterned to have a cascade structure. The mold layers 132, 142, 146, 148, and 152 may include a material having etch selectivity with respect to the insulating layers 131, 141, 145, 147, and 151.

The lower insulating layers 131 may include a material having lower hardness than the first intermediate insulating layers 141 and the second intermediate insulating layers 147. The upper insulating layers 151 may include a material having higher hardness than the first intermediate insulating layers 141 and the second intermediate insulating layers 147. The striation control insulating layers 145 may include a material having lower hardness than the first intermediate insulating layers 141 and the second intermediate insulating layers 147. In an example of the present inventive concept, the striation control insulating layers 145 may include a material having lower hardness than the lower insulating layers 131.

The lower mold layers 132 may include a material having lower hardness than the first intermediate mold layers 142 and the second intermediate mold layers 148. The upper mold layers 152 may include a material having higher hardness than the first intermediate mold layers 142 and the second intermediate mold layers 148. The striation control mold layers 146 may include a material having lower hardness than the first intermediate mold layers 142 and the second intermediate mold layers 148. In an example of the present inventive concept, the striation control mold layers 146 include a material having lower hardness than the lower mold layers 132.

In an example of the present inventive concept, the insulating layers 131, 141, 145, 147, and 151 may include silicon oxide. The lower insulating layers 131 may have a hardness which is 1% to 15% lower than those of the first intermediate insulating layers 141 and the second intermediate insulating layers 147, the striation control insulating layers 145 may have a hardness which is 1% to 15% lower than those of the first intermediate insulating layers 141 and the second intermediate insulating layers 147, and the upper insulating layers 151 may have a hardness which is 1% to 15% higher than those of the first intermediate insulating layers 141 and the second intermediate insulating layers 147.

In an example of the present inventive concept, the mold layers 132, 142, 146, 148, and 152 may include silicon nitride. The lower mold layers 132 may have a hardness which is 1% to 15% lower than those of the first intermediate mold layers 142 and the second intermediate mold layers 148, the striation control mold layers 146 may have a hardness which is 1% to 15% lower than those of the first intermediate mold layers 142 and the second intermediate mold layers 148, and the upper mold layers 152 may have hardness which is 1% to 15% higher than those of the first intermediate mold layers 142 and the second intermediate mold layers 148.

In an example of the present inventive concept, the insulating layers 131, 141, 145, 147, and 151 and the mold layers 132, 142, 146, 148, and 152 may be formed in the same chamber using an in-situ process. For example, the insulating layers 131, 141, 145, 147, and 151 and the mold layers 132, 142, 146, 148, and 152 may be formed using various types of chemical vapor deposition (CVD) methods or atomic layer deposition atomic layer deposition (ALD) methods.

The hardness of the insulating layers 131, 141, 145, 147, and 151 and the mold layers 132, 142, 146, 148, and 152 may be adjusted by controlling process conditions such as deposition temperature, deposition speed, bias power, or a combination thereof.

For example, the insulating layers 131, 141, 145, 147, and 151 may include silicon oxide. The first intermediate insulating layers 141 and the second intermediate insulating layers 147 may be formed using process conditions such as a first flow rate (sccm) of $SiH_4$, a first power (W) of RF power, and a first temperature (° C.) of process temperature. The lower insulating layers 131 may be formed using process conditions such as the first flow rate (sccm) of $SiH_4$, a second power (W) of RF power, and a second temperature (° C.) of process temperature. The second power (W) may be 0.1% to 30% lower than the first power (W). The second temperature (° C.) may be 0.1% to 30% lower than the first temperature (° C.). The striation control insulating layers 145 may be formed using process conditions such as the first flow rate (sccm) of $SiH_4$, a third power (W) of RF power, and a third temperature (° C.) of process temperature. The third power (W) may be 0.1% to 30% lower than the first power (W). The third temperature (° C.) may be 0.1% to 30% lower than the first temperature (° C.). The upper insulating layers 151 may be formed using process conditions such as a second flow rate (sccm) of $SiH_4$, the first power (W) of RF power, and the first temperature (° C.) of process temperature. The second flow rate (sccm) may be 0.1% to 30% higher than the first flow rate (sccm).

The mold layers 132, 142, 146, 148, and 152 include silicon nitride. The first intermediate mold layers 142 and the second intermediate mold layers 148 may be formed using process conditions such as a first $NH_3/SiH_4$ flow rate, a first pressure (torr) of chamber pressure, and a fourth temperature (° C.) of process temperature. The lower mold layers 132 may be formed using process conditions such as the first $NH_3/SiH_4$ flow rate, the first pressure (torr) of chamber pressure, and a fifth temperature (° C.) of process temperature. The fifth temperature (° C.) may be 0.1% to 30% lower than the fourth temperature (° C.). The striation control mold layers 146 may be formed using process conditions such as the first $NH_3/SiH_4$ flow rate, the first pressure (torr) of chamber pressure, and a sixth temperature (° C.) of process temperature. The sixth temperature (° C.) may be 0.1% to 30% lower than the fourth temperature (° C.). The upper mold layers 152 may be formed using process conditions such as a second $NH_3/SiH_4$ flow rate, a second pressure (torr) of chamber pressure, and the fourth temperature (° C.) of process temperature. The second $NH_3/SiH_4$ flow rate may be 0.1% to 30% higher than the first $NH_3/SiH_4$ flow rate. The second pressure (torr) may be 0.1% to 30% higher than the first pressure (torr).

Figure 11:
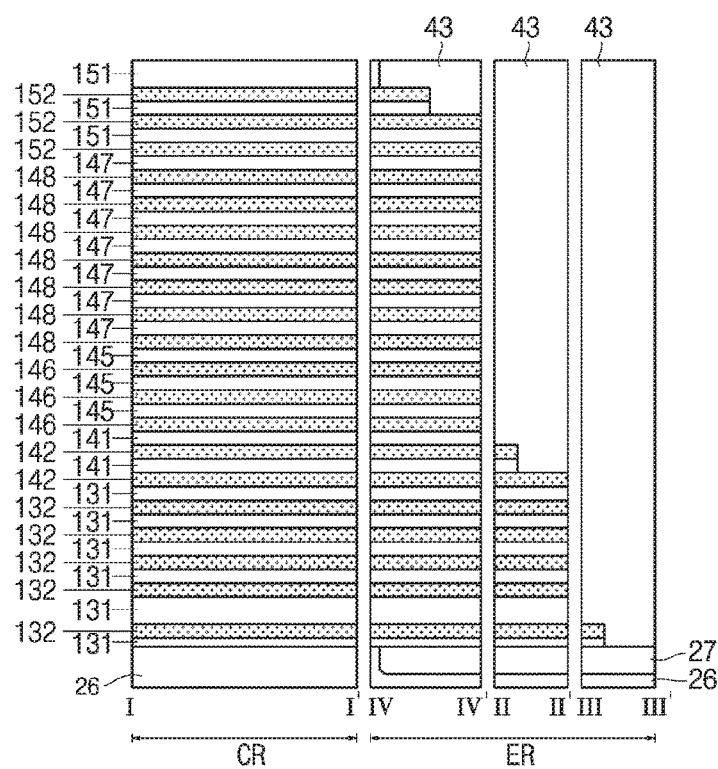

Referring to FIGS. 5 and 11, the insulating interlayer 43 may be formed. The insulating interlayer 43 may cover the substrate 26 in the connection region ER. The insulating interlayer 43 may cover edges of the insulating layers 131, 141, 145, 147, and 151 and the mold layers 132, 142, 146, 148, and 152, which are formed in a cascade structure.

The insulating interlayer 43 may include an insulating material such as silicon oxide, silicon nitride, silicon oxynitride, or a combination thereof. The insulating interlayer 43 may be formed under substantially the same process conditions as any of the processes of forming the insulating layers 131, 141, 145, 147, and 151 and may include silicon oxide having substantially the same hardness as any of the insulating layers 131, 141, 145, 147, and 151. For example, the insulating interlayer 43 may be formed under substantially the same process conditions as the first intermediate insulating layers 141 and the second intermediate insulating layers 147 and may include silicon oxide having substantially the same hardness as the first intermediate insulating layers 141 and the second intermediate insulating layers 147.

Figure 12:
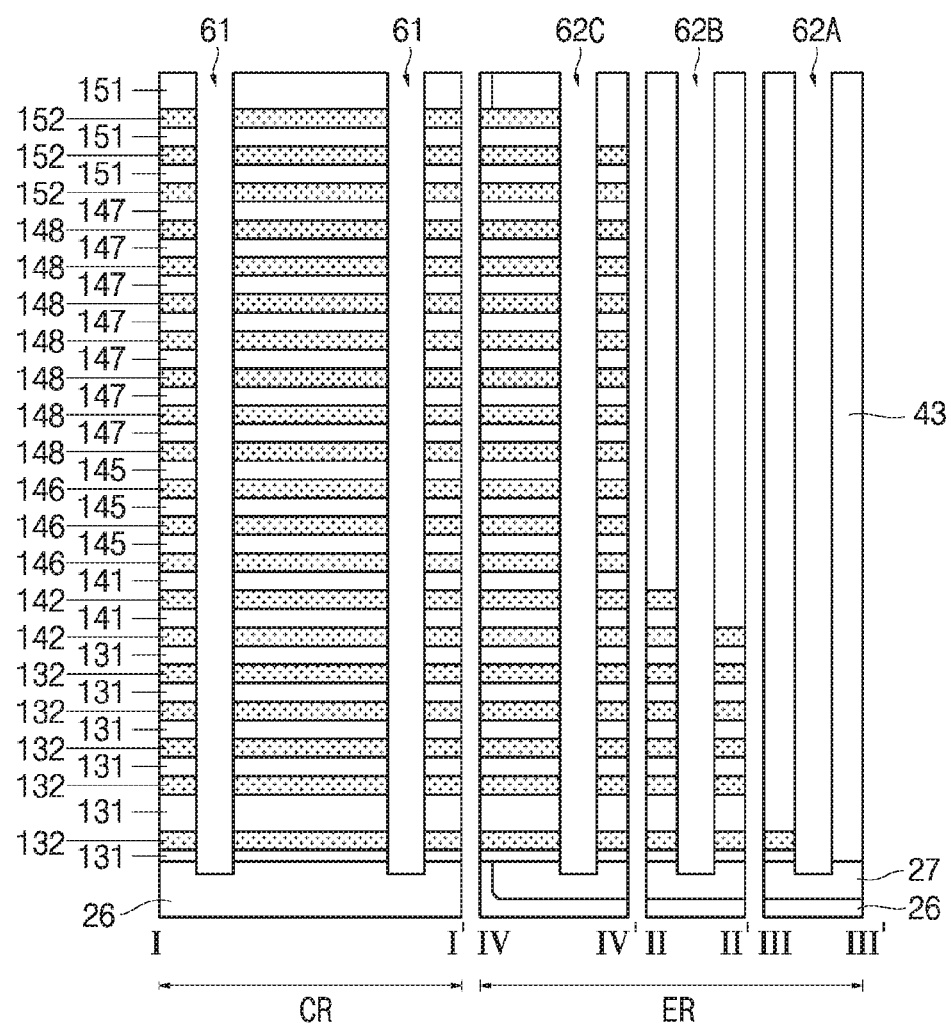

Referring to FIGS. 5 and 12, channel holes 61 may be formed in the cell region CR and dummy holes 62A, 62B, and 62C may be formed in the connection region ER using a patterning process. The dummy holes 62A, 62B, and 62C may include a first dummy hole 62A close to an edge of the connection region ER, a second dummy hole 62B between the first dummy hole 62A and the channel holes 61, and a third dummy hole 62C between the second dummy hole 62B and the channel holes 61.

The channel holes 61 may pass through the insulating layers 131, 141, 145, 147, and 151 and the mold layers 132, 142, 146, 148, and 152. The substrate 26 may be exposed at bottoms of the channel holes 61. The dummy holes 62A, 62B, and 62C may pass through the insulating interlayer 43, the insulating layers 131, 141, 145, 147, and 151, and the mold layers 132, 142, 146, 148, and 152. The device isolation layer 27 may be exposed at bottoms of the dummy holes 62A, 62B, and 62C. The first dummy hole 62A may be formed in edges of the insulating layers 131, 141, 145, 147, and 151 and the mold layers 132, 142, 146, 148, and 152. The second dummy hole 62B may be formed between the first dummy hole 62A and the third dummy hole 62C. The third dummy hole 62C may be formed to be close to the channel holes 61.

In an example of the present inventive concept, a patterning process of forming the channel holes 61 and the dummy holes 62A, 62B, and 62C includes an anisotropic etching process. The channel holes 61 and the dummy holes 62A, 62B, and 62C may be simultaneously formed. An etch rate of the patterning process may be affected by the hardness of each of the insulating layers 131, 141, 145, 147, and 151 and the mold layers 132, 142, 146, 148, and 152. An etch rate may be relatively high when the hardness is low, and the etch rate may be relatively low when the hardness is high. Profiles of the channel holes 61 and the dummy holes 62A, 62B, and 62C may be controlled by the hardness of each of the insulating layers 131, 141, 145, 147, and 151 and the mold layers 132, 142, 146, 148, and 152.

Figure 13:
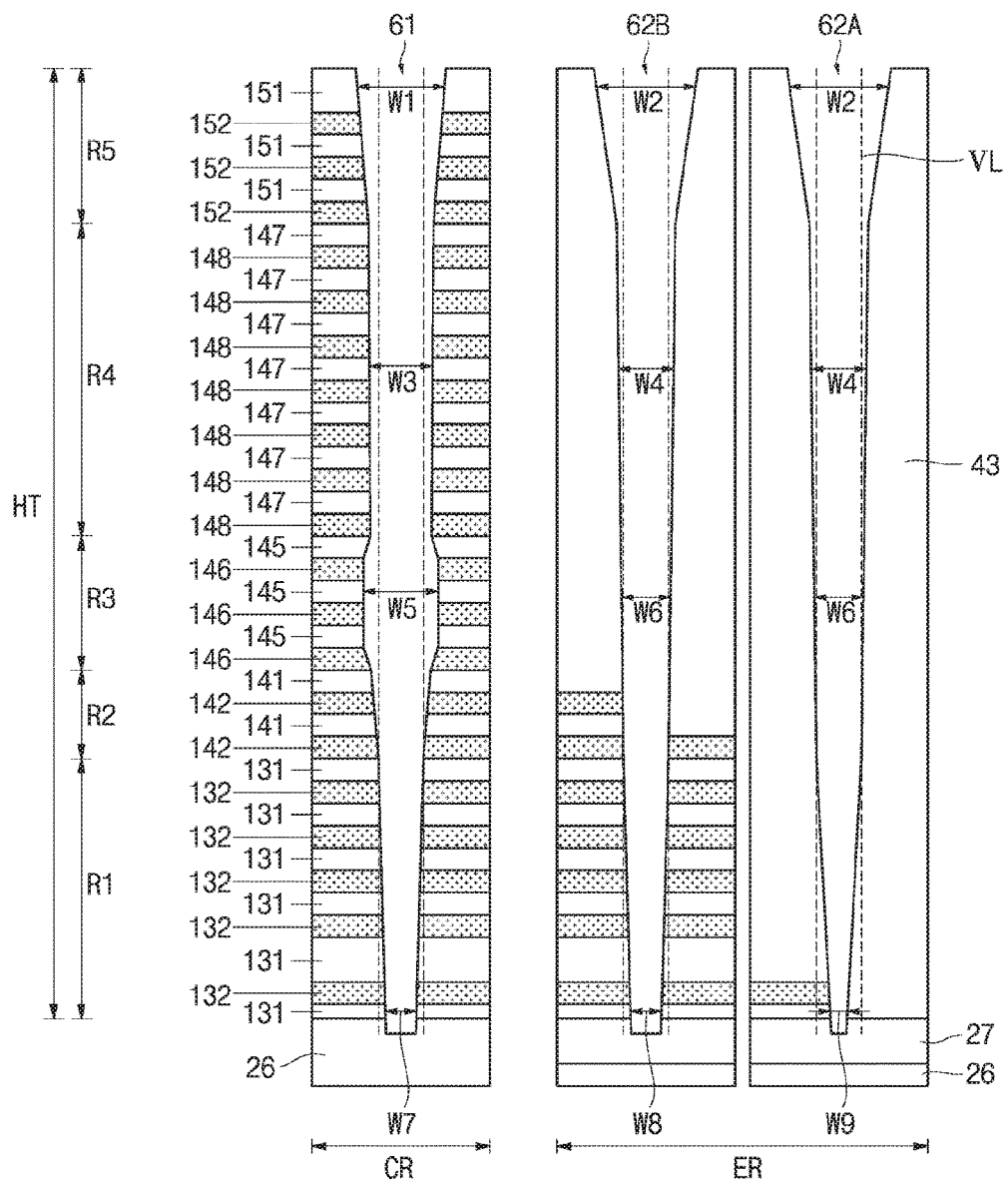
Figure 14:
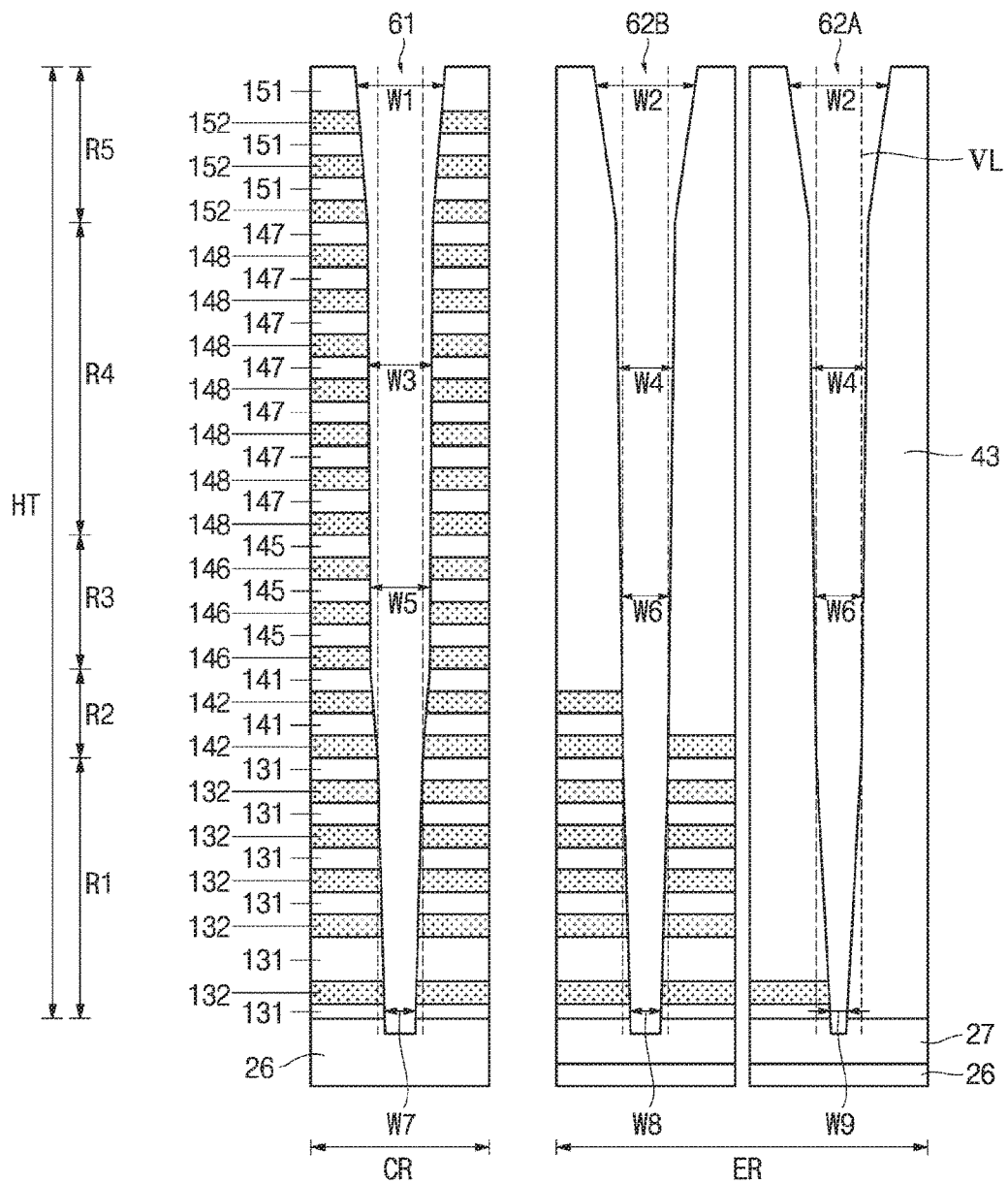
Figure 15:
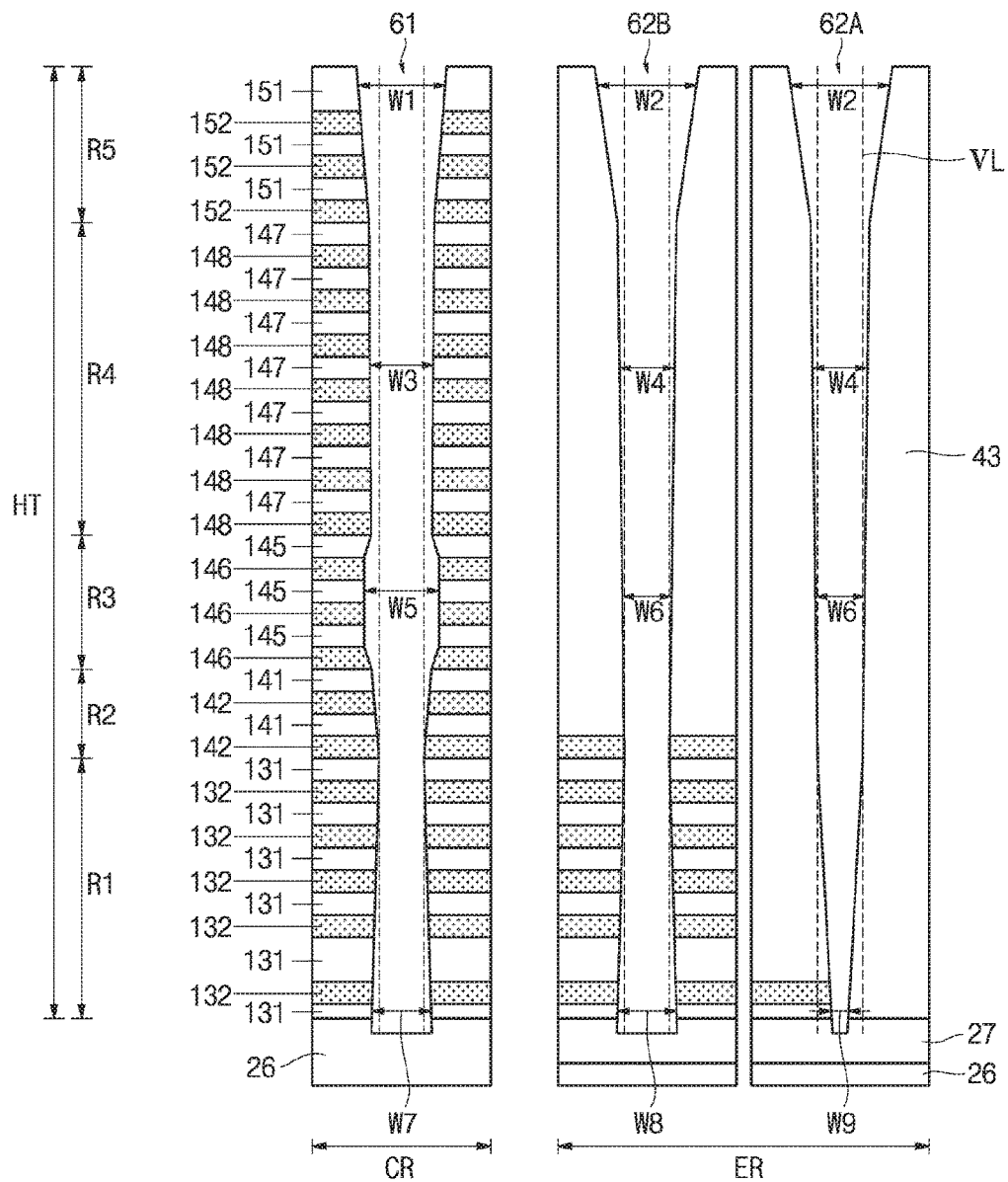

In examples of the present inventive concept, the channel holes 61 and the dummy holes 62A, 62B, and 62C may be formed as shown in any of FIGS. 13 to 15.

Referring to the example of FIG. 13, a first region R1, a second region R2, a third region R3, a fourth region R4, and a fifth region R5 may be defined between the bottom and top of a stacked-layer structure including the insulating layers 131, 141, 145, 147, and 151 and the mold layers 132, 142, 146, 148, and 152. The insulating layers 131, 141, 145, 147, and 151 and the mold layers 132, 142, 146, 148, and 152 may have a first height HT. The lower insulating layers 131 and the lower mold layers 132 may be formed in the first region R1, the first intermediate insulating layers 141 and the first intermediate mold layers 142 may be formed in the second region R2, the striation control insulating layers 145 and the striation control mold layers 146 may be formed in the third region R3, the second intermediate insulating layers 147 and the second intermediate mold layers 148 may be formed in the fourth region R4, and the upper insulating layers 151 and the upper mold layers 152 may be formed in the fifth region R5. The uppermost surface of the lower insulating layers 131 and the lower mold layers 132 may be formed at a level in a range of 0.3 times to 0.4 times the first height HT from the bottom the stacked structure 12 or upper surface of the substrate 26. The lowermost surface of the upper insulating layers 151 and the upper mold layers 152 may be formed at a level in a range of 0.5 times to 0.9 times the first height HT from the bottom the stacked structure 12 or upper surface of the substrate 26. The striation control insulating layers 145 and the striation control mold layers 146 may be formed in a range of 0.3 times to 0.7 times the first height HT from the bottom the stacked structure 12 or upper surface of the substrate 26.

In the fifth region R5, an upper portion of the channel hole 61 may pass through the upper insulating layers 151 and the upper mold layers 152. The upper portion of the channel hole 61 may have a width which increases in the upward direction, i.e., away from the substrate 26. The upper end of the channel hole 61 may have a first width W1. The upper portions of the dummy holes 62A and 62B may pass through the insulating interlayer 43 at substantially the same horizontal level as the fifth region R5. The upper portion of each of the dummy holes 62A and 62B may have a width which increases in the upward direction, i.e., in the vertical direction (along lines VL) away from the substrate 26. An upper end of each of the dummy holes 62A and 62B may have a second width W2. The upper insulating layers 151 and the upper mold layers 152 may serve to limit the width to which an upper region of the channel hole 61 is formed. The first width W1 may be smaller than the second width W2. An angle subtended by a surface defining the side of the channel hole 61 and a line VL perpendicular to the surface of the substrate 26 may be smaller than each of the angles subtended by the surfaces defining sides of the dummy holes 62A and 62B and lines VL perpendicular to the surface of the substrate 26.

In an example of the present inventive concept, the first width W1 may be different from the second width W2. The second width W2 may be smaller than the first width W1.

In the fourth region R4, the channel hole 61 may pass through the second intermediate insulating layers 147 and the second intermediate mold layers 148. The channel hole 61 may have a third width W3. Each of the dummy holes 62A and 62B may have a fourth width W4 at substantially the same horizontal level as the fourth region R4.

In the third region R3, the channel hole 61 may pass through the striation control insulating layers 145 and the striation control mold layers 146. The channel hole 61 may have a fifth width W5. Each of the dummy holes 62A and 62B may have a sixth width W6 at substantially the same horizontal level as the third region R3. As confirmed by the present inventors, striation failures may easily occur in a region 0.3 times to 0.7 times the height HT of the stack, i.e., from the lower surface of the lowermost insulating layer 130 constituting the stacked structure 12 or from the substrate 26 in the examples of the present inventive concept. The striation control insulating layers 145 and the striation control mold layers 146 may serve to suppress the occurrence of striations in the channel hole 61. The fifth width W5 may be greater than the sixth width W6. In an example of the present inventive concept, the fifth width W5 is greater than the third width W3.

In the first region R1, a lower portion of the channel hole 61 may pass through the lower insulating layers 131 and the lower mold layers 132. The lower portion of the channel hole 61 may have a width which decreases in the downward direction, i.e., in the vertical direction (along lines VL) towards the substrate 26. The lower insulating layers 131 and the lower mold layers 132 may serve to prevent a lower end of the channel hole 61 from becoming excessively narrow. The lower end of the channel hole 61 may have a seventh width W7. The lower portion of the second dummy hole 62B may pass through the lower insulating layers 131 and the lower mold layers 132 at substantially the same horizontal level as the first region R1. The lower portion of the second dummy hole 62B may have a width which decreases in the downward direction, i.e., in the vertical direction (along lines VL) towards the substrate 26. The lower insulating layers 131 and the lower mold layers 132 may serve to prevent a lower end of the second dummy hole 62B from becoming excessively narrow. The lower end of the second dummy hole 62B may have an eighth width W8. The eighth width W8 may be substantially the same as the seventh width W7. The lower portion of the first dummy hole 62A may pass through part of structure comprising the insulating interlayer 43, the lower insulating layers 131, and the lower mold layers 132 at substantially the same horizontal level as the first region R1. The lower portion of the first dummy hole 62A may have a width which decreases in the downward direction, i.e. in the vertical direction (along lines VL) towards the substrate 26. A lower end of the first dummy hole 62A may have a ninth width W9. The ninth width W9 may be smaller than the seventh width W7. An angle subtended by a surface defining the side of the channel hole 61 and a line VL perpendicular to the surface of the substrate 26 may be smaller than an angle subtended by a surface defining the side of the first dummy hole 62A and the line VL perpendicular to the surface of the substrate 26.

Although not shown in FIG. 13, the third dummy hole 62C may have a profile similar to that of a combination of the channel hole 61 and the second dummy hole 62B. In an example of the present inventive concept, an upper region of the third dummy hole 62C may be similar to that of the second dummy hole 62B, and an intermediate region and a lower region of the third dummy hole 62C may be similar to those of the channel hole 61.

Referring to FIG. 14, in the third region R3, a shape of the channel hole 61 may be controlled by the hardness of the striation control insulating layers 145 and the striation control mold layers 146. In examples of the present inventive concept, the fifth width W5 of the channel hole 61 may be smaller than or equal to the third width W3 of the channel hole 61.

Referring to FIG. 15, in the first region R1, the channel hole 61 may have a width which increases in a direction of a lower portion thereof. The second dummy hole 62B may have a width which increases in a direction of a lower portion thereof at substantially the same horizontal level as the first region R1. The first dummy hole 62A may have a width which decreases in a direction of a lower portion thereof at substantially the same horizontal level as the first region R1. The ninth width W9 of the first dummy hole 62A may be smaller than the seventh width W7 of the channel hole 61.

Figure 16:
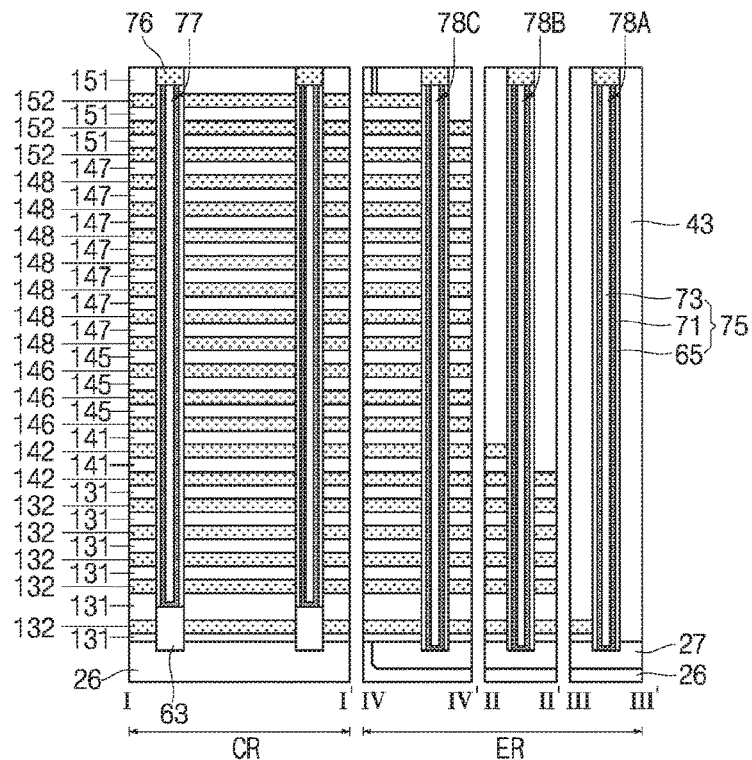

Referring to FIGS. 5 and 16, the cell pillars 77 may be formed in the channel holes 61, and the dummy pillars 78A, 78B, and 78C may be formed in the dummy holes 62A, 62B, and 62C. Each of the cell pillars 77 may include a semiconductor pattern 63, a channel structure 75, and a conductive pad 76. Each of the dummy pillars 78A, 78B, and 78C may include the channel structure 75 and the conductive pad 76. The channel structure 75 may include a data storage pattern 65, a channel pattern 71, and a core pattern 73. The dummy pillars 78A, 78B, and 78C may include a first dummy pillar 78A inside the first dummy hole 62A, a second dummy pillar 78B inside the second dummy hole 62B, and a third dummy pillar 78C inside the third dummy hole 62C.

The semiconductor pattern 63 may be formed in a lower region of the channel holes 61 using a selective epitaxial growth (SEG) process. In an example of the present inventive concept, the semiconductor pattern 63 may include single crystalline silicon including P-type impurities. The channel structure 75 may be formed on the semiconductor pattern 63 inside each of the channel holes 61. A process of forming the channel structure 75 may include a process of forming a plurality of thin films and an etch-back process.

The core pattern 73 may include an insulating material such as silicon oxide, silicon nitride, silicon oxynitride, or a combination thereof. In an example of the present inventive concept, the core pattern 73 may include polysilicon. The channel pattern 71 may surround side surfaces and a lower portion of the core pattern 73. The channel pattern 71 may include a semiconductor layer such as a polysilicon layer. The channel pattern 71 may contact the semiconductor pattern 63. The data storage pattern 65 may be formed to surround an outer side of the channel pattern 71. During a process of forming the channel structure 75 in the channel holes 61, the channel structure 75 may be formed inside each of the dummy holes 62A, 62B, and 62C. In the dummy holes 62A, 62B, and 62C, the channel structure 75 may contact the device isolation layer 27.

As described with reference to FIGS. 7 to 9, the data storage pattern 65 may include the tunnel insulating layer 66 surrounding the outer side of the channel pattern 71, the charge storage layer 67 surrounding an outer side of the tunnel insulating layer 66, and the first blocking layer 68 surrounding an outer side of the charge storage layer 67. The data storage pattern 65 may include a plurality of insulating layers including silicon oxide, silicon nitride, silicon oxynitride, a high-K dielectric, or a combination thereof. In an example of the present inventive concept, the tunnel insulating layer 66 comprises silicon oxide, the charge storage layer 67 comprises silicon nitride, and the first blocking layer 68 comprises aluminum oxide (AlO).

The conductive pad 76 may be formed on the channel structure 75. The conductive pad 76 may be formed using a thin film forming process and a planarization process. The planarization process may include a chemical mechanical polishing (CMP) process, an etch-back process, or a combination thereof. The conductive pad 76 may contact the channel pattern 71. The conductive pad 76 includes conductive material such as polysilicon, a metal, a metal silicide, a metal oxide, a metal nitride, conductive carbon, or a combination thereof.

Figure 17:
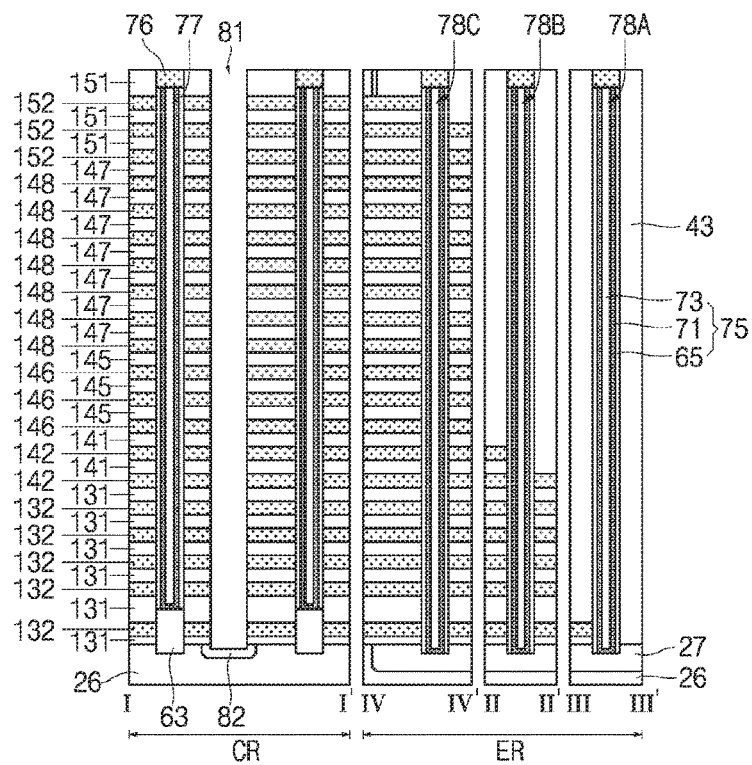

Referring to FIGS. 5 and 17, a trench 81 and an impurity region 82 may be formed. The impurity region 82 may correspond to a common source region.

The trench 81 passing through the insulating layers 131, 141, 145, 147, and 151 and the mold layers 132, 142, 146, 148, and 152 may be formed using a patterning process. The impurity region 82 may be formed in the substrate 26 exposed at a bottom of the trench 81 using an ion implanting process. In examples of the present inventive concept, the impurity region 82 includes N-type impurities such as phosphorus (P) or arsenic (As). Side surfaces of the insulating layers 131, 141, 145, 147, and 151 and the mold layers 132, 142, 146, 148, and 152 may be exposed at sides of the trench 81.

Figure 18:
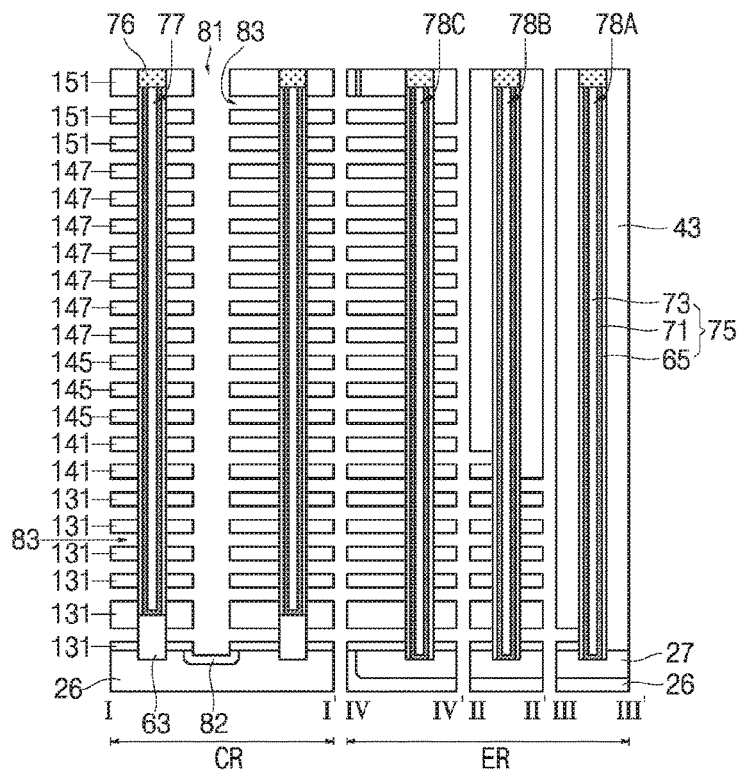

Referring to FIGS. 5 and 18, openings 83 may be formed by removing the mold layers 132, 142, 146, 148, and 152. A process of removing the mold layers 132, 142, 146, 148, and 152 may include an isotropic etching process.

Figure 19:
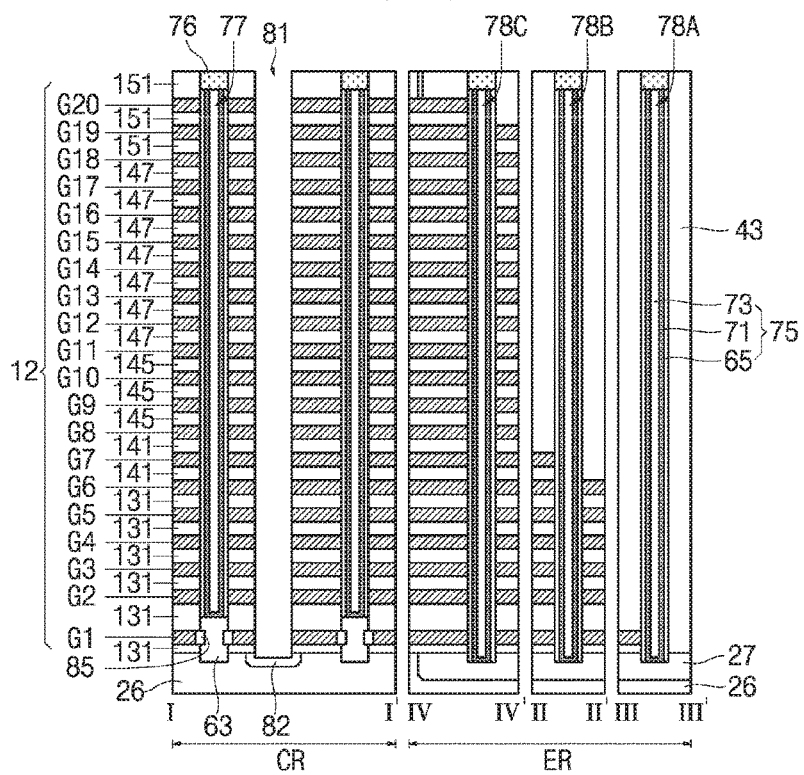

Referring to FIGS. 5 and 19, a gate insulating layer 85 and gate electrodes G1 to G20 may be formed.

The gate insulating layer 85 may be formed on a side surface of the semiconductor pattern 63 exposed at the openings 83. In an example of the present inventive concept, the gate insulating layer 85 is a thermal oxide layer. A process of forming the gate electrodes G1 to G20 may include a thin film forming process and an etching process. The etching process may include an anisotropic etching process, an isotropic etching process, or a combination thereof. The gate electrodes G1 to G20 may be formed in the openings 83. The gate electrodes G1 to G20 may include conductive material such as a metal, a metal silicide, a metal oxide, a metal nitride, polysilicon, conductive carbon, or a combination thereof. For example, the gate electrodes G1 to G20 may include Ti, TiN, Ta, TaN, W, WN, Ru, Pt, or a combination thereof.

In an example of the present inventive concept, as shown in FIGS. 7 and 8, the second blocking layer 69 is formed before forming the gate electrodes G1 to G20. The second blocking layer 69 may cover upper surfaces and lower surfaces of the gate electrodes G1 to G20 and may be interposed between the gate electrodes G1 to G20 and the first blocking layer 68. The second blocking layer 69 may include an insulating layer including silicon oxide, silicon nitride, silicon oxynitride, high-K dielectric, or a combination thereof.

Figure 20:
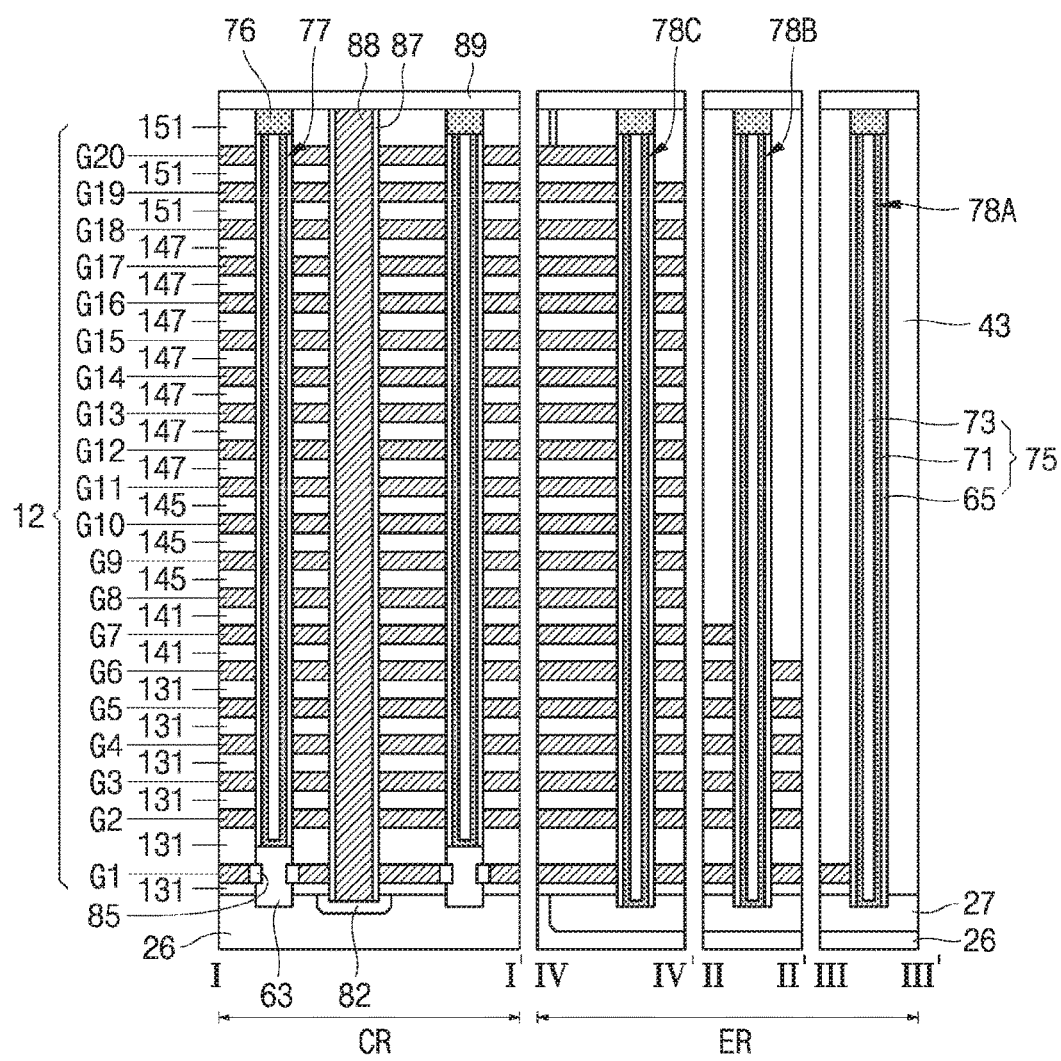

Referring to FIGS. 5 and 20, a spacer 87, a source line 88, and a capping layer 89 may be formed.

The spacer 87 may be formed using a thin film forming process and an anisotropic etching process. The spacer 87 may line sides of the trench 81. The spacer 87 may include an insulating layer including silicon oxide, silicon nitride, silicon oxynitride, a high-K dielectric, a low-K dielectric, or a combination thereof. The source line 88 may be formed in the trench 81. A process of forming the source line 88 may include a thin film forming process and a planarization process. The source line 88 may include conductive material such as a metal, a metal silicide, a metal oxide, a metal nitride, polysilicon, conductive carbon, or a combination thereof. The source line 88 may be in contact with the impurity region 82. The spacer 87 may be interposed between the source line 88 and the gate electrodes G1 to G20. The capping layer 89 may cover the substrate 26. The capping layer 89 may include an insulating layer including silicon oxide, silicon nitride, silicon oxynitride, a high-K dielectric, a low-K dielectric, or a combination thereof.

In an example of the present inventive concept, the source line 88 may be a source plug. The source line 88 may thus be referred to as a source region of the device.

Referring again to FIGS. 5 and 6, the bit plug 91, the bit line BL, the interconnection plug 93, and the metal line 95 may be formed.

The bit plug 91 may pass through the capping layer 89 and may be in contact with the conductive pad 76, and the interconnection plug 93 may pass through the capping layer 89 and the insulating interlayer 43 and may be in contact with one of the gate electrodes G1 to G20. The bit line BL may be formed on the capping layer 89 and may be in contact with the bit plug 91. The metal line 95 may be formed on the capping layer 89 and may be in contact with the interconnection plug 93. The bit plug 91, the bit line BL, the interconnection plug 93, and the metal line 95 may include conductive material such as a metal, a metal silicide, a metal oxide, a metal nitride, polysilicon, conductive carbon, or a combination thereof.

Figure 21:
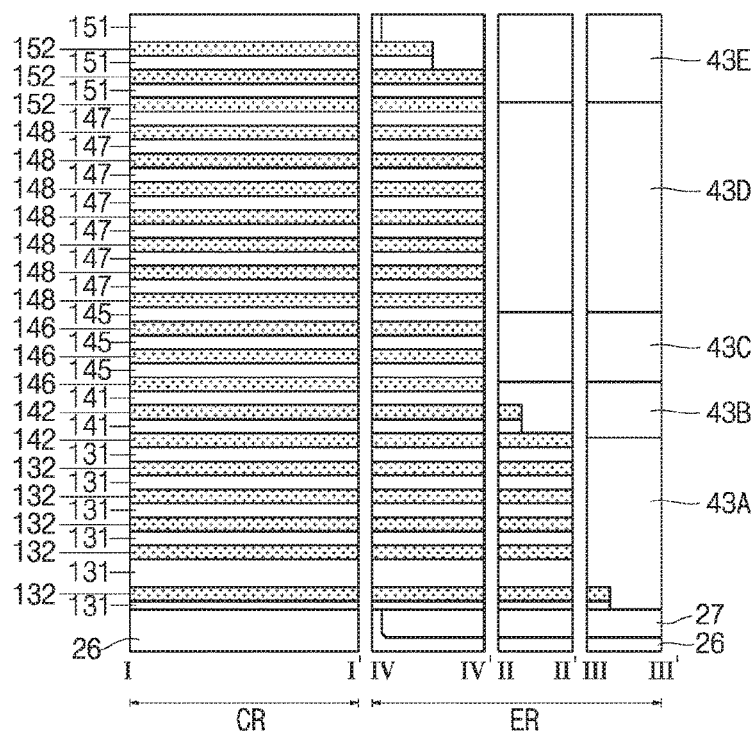
FIGS. 21 and 22 are cross-sectional views taken along lines I-I', II-II', III-III', and IV-IV' of FIG. 5 for illustrating another example of a method of forming a semiconductor device according to the present inventive concept.
Figure 22:
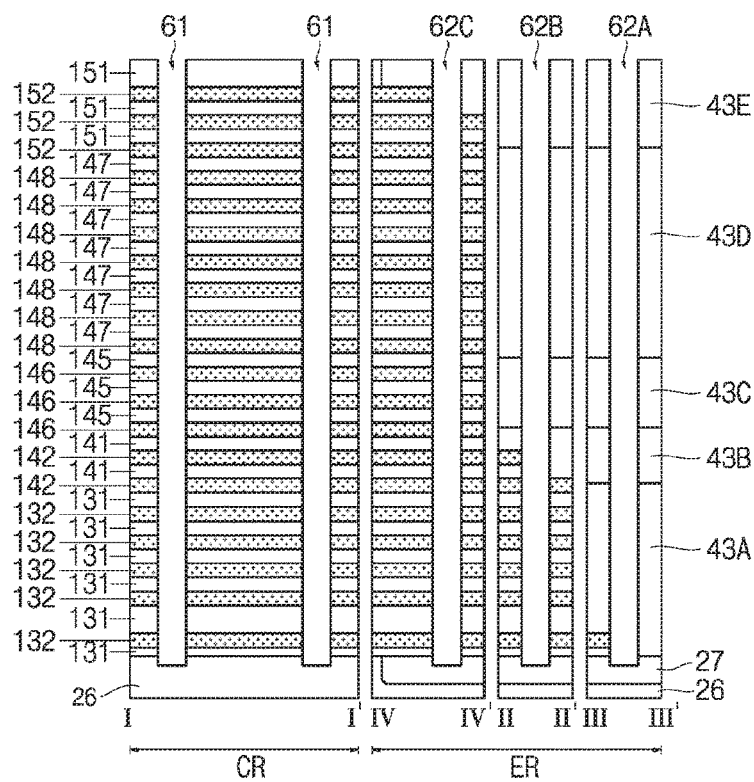
Figure 23:
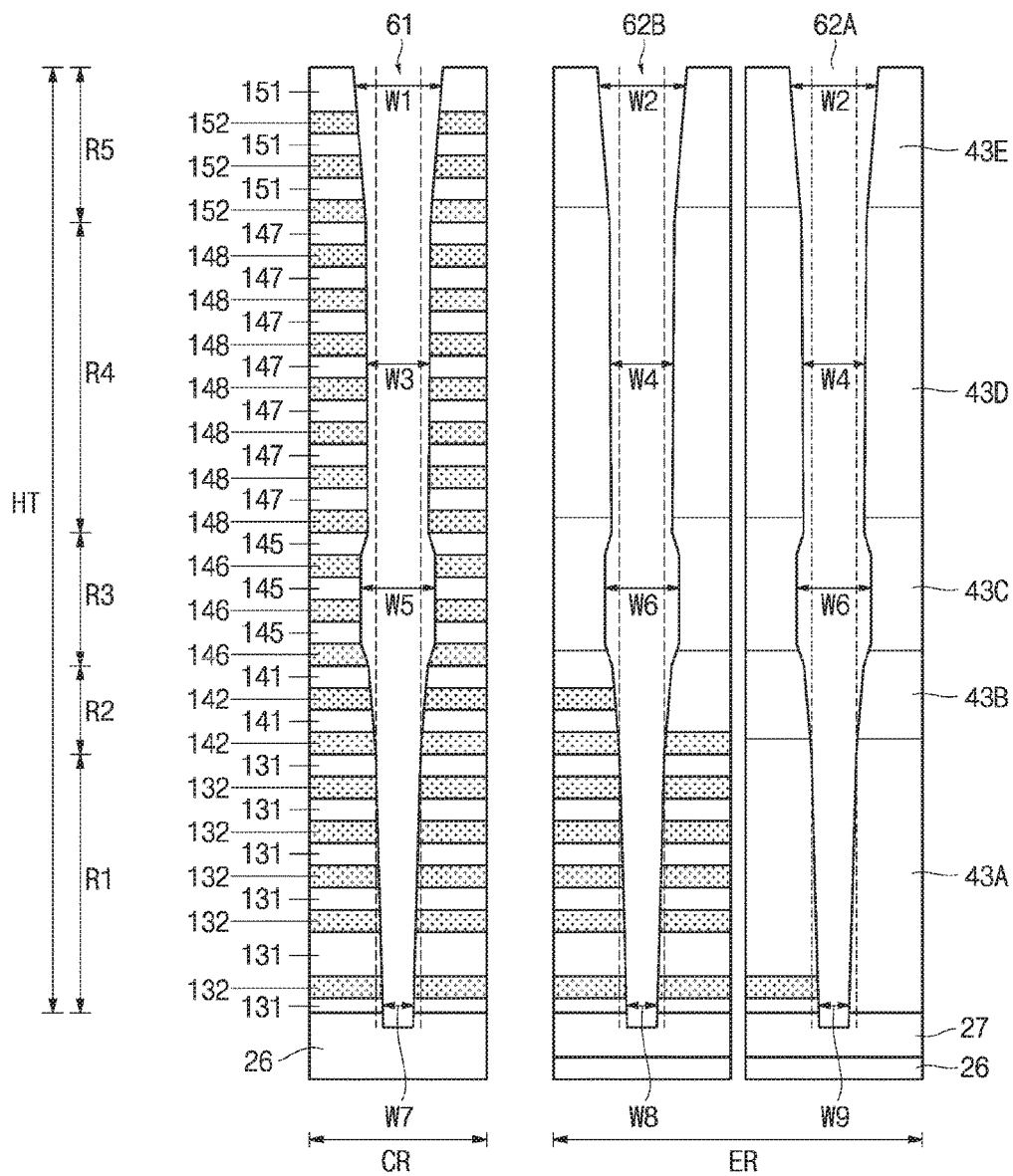
FIG. 23 is a partially enlarged view of the part of the device at the stage of manufacture illustrated in FIG. 22.

FIGS. 21 and 22 are cross-sectional views taken in a direction corresponding to the direction of lines I-I', II-II', III-III', and IV-IV' of FIG. 5 for describing other examples of a method of forming a semiconductor device according to the present inventive concept, and FIG. 23 is a partially enlarged view illustrating a part of FIG. 22. Hereinafter, mainly only those aspects or features different from those described with reference to FIGS. 1 to 20 will be briefly described.

Referring to FIGS. 5 and 21, the insulating interlayer may be formed by forming a plurality of individual interlayer insulating layers 43A, 43B, 43C, 43D, and 43E. The plurality of interlayer insulating layers 43A, 43B, 43C, 43D, and 43E may include a first interlayer insulating layer 43A, a second interlayer insulating layer 43B, a third interlayer insulating layer 43C, a fourth interlayer insulating layer 43D, and a fifth interlayer insulating layer 43E. For ease of description, these individual interlayer insulating layers 43A-43E will each be referred to as merely an insulating interlayer.

The first insulating interlayer 43A may be of material having substantially the same hardness as the lower insulating layers 131. The second insulating interlayer 43B may be of material having substantially the same hardness as the first intermediate insulating layers 141. The third insulating interlayer 43C may be of material having substantially the same hardness as the striation control insulating layers 145. The fourth insulating interlayer 43D may be of material having substantially the same hardness as the second intermediate insulating layers 147. The fifth insulating interlayer 43E may be of material having substantially the same hardness as the upper insulating layers 151.

Referring to FIGS. 5 and 22, channel holes 61 and dummy holes 62A, 62B, and 62C may be formed. As shown in FIG. 23, the dummy holes 62A, 62B, and 62C may have profiles similar to those of the channel holes 61.

Referring to FIG. 23, in a fifth region R5, an upper end of a channel hole 61 may have a first width W1. The fifth insulating interlayer 43E may serve to prevent the upper regions of the dummy holes 62A and 62B from becoming excessively wide when the dummy holes 62A and 62B are formed. An upper end of each of the dummy holes 62A and 62B may have a second width W2 at a level the same as that at which the first width W1 is taken within the fifth region R5. The first width W1 may be the same as the second width W2.

In a third region R3, the channel hole 61 may have a fifth width W5. Each of the dummy holes 62A and 62B may have a sixth width W6 at substantially the same horizontal level as that at which the sixth width W6 is taken in the third region R3. The sixth width W6 may be the same as the fifth width W5.

In a first region R1, a lower end of the channel hole 61 may have a seventh width W7. The first insulating interlayer 43A may serve to prevent lower regions of the dummy holes 62A and 62B from becoming too narrow when the dummy holes 62A and 62B are formed. A lower end of the second dummy hole 62B may have an eighth width W8 at substantially the same horizontal level as that at which the seventh width W7 is taken in the first region R1, and a lower end of the first dummy hole 62A may have a ninth width W9 at substantially the same horizontal level as that at which the seventh width W7 is taken in the first region R1. The ninth width W9, the eighth width W8, and the seventh width W7 may all be the same.

According to the examples described with reference to FIGS. 1 to 23, variations in the diameter or width of the channel hole 61 along the length (in the vertical direction) thereof can be significantly minimized, especially in the case in which the channel hole 61 formed by an etch process has a high aspect ratio. The cell pillars 77 may have substantially the same profile as the channel holes 61. Thus, variations in the diameter or width of the cell pillars 77 along the length thereof can be significantly minimized.

Figure 24:
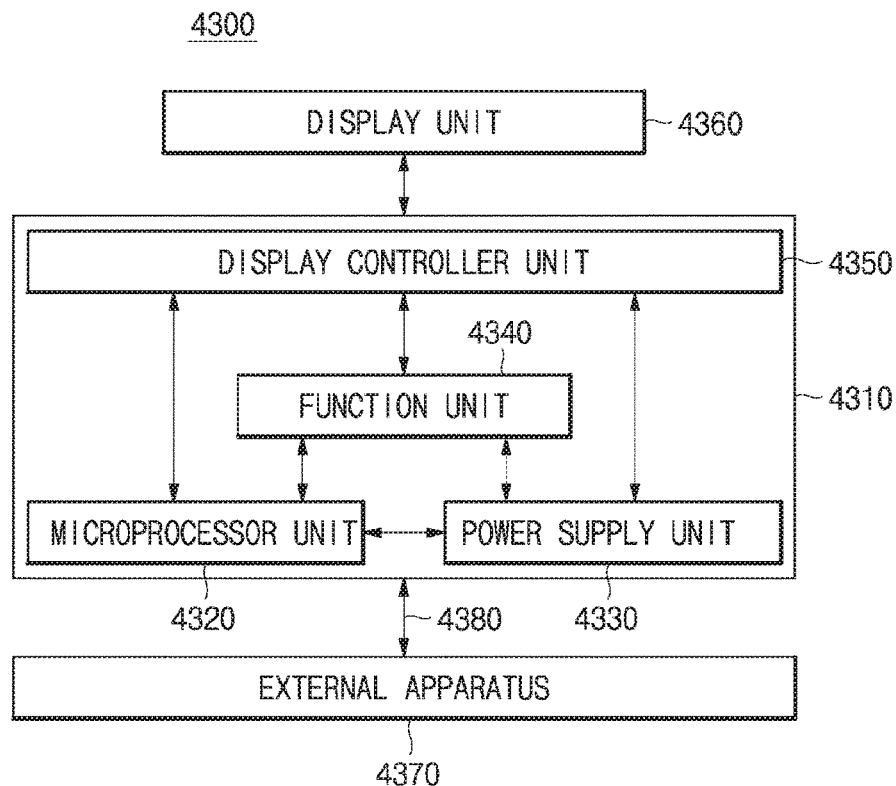
FIGS. 24 and 25 are block diagrams illustrating electronic systems including a semiconductor device according to the present inventive concept.

FIG. 24 is a block diagram illustrating an example of an electronic system 4300 including a semiconductor device according to the present inventive concept.

Referring to FIG. 24, the electronic system 4300 may include a body 4310. The body 4310 may be a system board or a mother board including a printed circuit board (PCB) or the like. A microprocessor unit 4320, a power supply unit 4330, a function unit 4340, and/or a display controller unit 4350 may be mounted on the body 4310. A display unit 4360 may be disposed on an upper surface of the body 4310 or outside the body 4310. For example, the display unit 4360 may be disposed on a surface of the body 4310 to display an image processed by the display controller unit 4350.

The power supply unit 4330 may supply power to the microprocessor unit 4320, the function unit 4340, and the display controller unit 4350. The microprocessor unit 4320 may control the function unit 4340 and the display unit 4360. The function unit 4340 may perform various functions of the electronic system 4300. For example, when the electronic system 4300 is a mobile electronic product such as a portable phone, the function unit 4340 may include various components capable of performing wireless communication functions, such as outputting an image to the display unit 4360 and outputting a voice to a speaker, by dialing or communication with an external apparatus 4370, and serve as an image processor when a camera is included in the electronic system 4300. In an example of the present inventive concept, when the electronic system 4300 is connected to a memory card or the like to expand a capacity thereof, the function unit 4340 may be a memory card controller. The function unit 4340 may exchange signals with the external apparatus 4370 through a wired or wireless communication unit 4380. Further, when the electronic system 4300 needs a Universal Serial Bus (USB) for expansion of functions thereof, the function unit 4340 may serve as an interface controller.

In an example of the present inventive concept, a semiconductor device according to the inventive concept, such as any of the examples described with reference to FIGS. 1 to 23, may be included in at least one of the microprocessor unit 4320 and the function unit 4340. Such a semiconductor device facilitates mass production and cost competitiveness, and offers improved device characteristics. Thus, semiconductor devices according to the inventive concept can be widely used in various components of the electronic system 4300, thereby contributing to the overall performance of the electronic system 4300.

Figure 25:
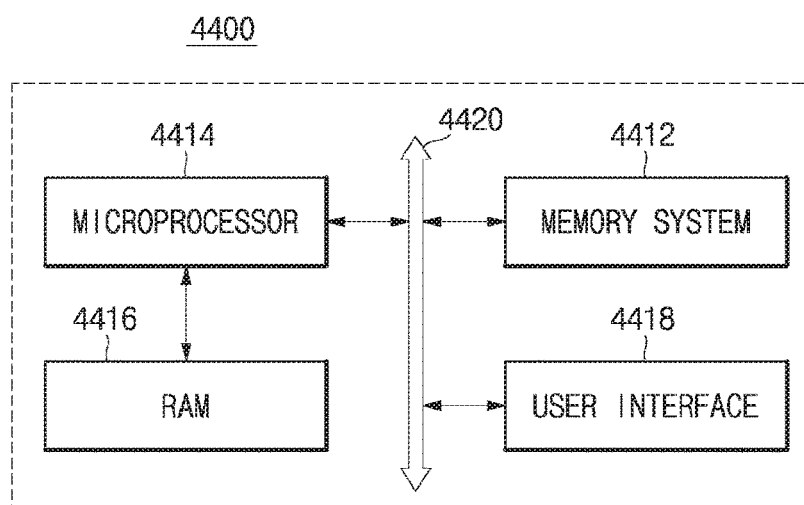

FIG. 25 is a block diagram illustrating examples of an electronic system 4400 including a semiconductor device according to the present inventive concept.

Referring to FIG. 25, the electronic system 4400 may include a memory system 4412, a microprocessor 4414, a random access memory (RAM) 4416, a user interface 4418, and a bus 4420. The microprocessor 4414 may program and control the electronic system 4400. The RAM 4416 may be used as an operational memory of the microprocessor 4414. The microprocessor 4414, the RAM 4416, and/or other components may be assembled in a single package. The user interface 4418 may serve to input or output data to or from the electronic system 4400. The memory system 4412 may serve to store operating code of the microprocessor 4414, data processed by the microprocessor 4414, or external input data. The memory system 4412 may include a controller and a memory.

The electronic system 4400 may be applied to a mobile apparatus or a computer. In an example of the present inventive concept, a semiconductor device according to the inventive concept, such as any of the examples described with reference to FIGS. 1 to 23, may be included in at least one of the memory system 4412 and the microprocessor 4414, thereby contributing to cost savings in manufacturing and performance of the electronic system 4400.

According to an example of the present inventive concept, lower insulating layers having lower hardness than intermediate insulating layers and upper insulating layers having higher hardness than the intermediate insulating layers can be provided. A plurality of shape control insulating layers can be formed between the intermediate insulating layers, between the intermediate insulating layers and the lower insulating layers, or between the upper insulating layers and the intermediate insulating layers. The shape control insulating layers can have lower hardness than the intermediate insulating layers. A pillar passing through the upper insulating layers, the intermediate insulating layers, the shape control insulating layers, and the lower insulating layers can be formed. Variations in the diameter or width of the pillar along the length thereof (i.e., in the vertical direction) can be significantly reduced. A semiconductor device having a high degree of uniformity of electrical characteristics can thus be realized. In particular, a 3D semiconductor memory device having a high degree of uniformity of electrical characteristics among its various different memory sections in a vertical direction can thus be realized.

Finally, although examples of the present inventive concept have been described with reference to the accompanying drawings, those skilled in the art will understand that the present inventive concept may be embodied in other specific forms without departing from the spirit or essential characteristics thereof. It should thus be understood that the above-described examples are illustrative of and non-limiting when it comes to the present inventive concept as defined by the appended claims.

What is claimed is:

1. A semiconductor device comprising:
a substrate;
a stacked-layer structure having insulating layers and gate electrodes, the insulating layers alternately stacked with the gate electrodes on the substrate; and
a pillar passing through the stacked-layer structure, wherein:
the insulating layers include a plurality of lower insulating layers, a plurality of intermediate insulating layers on the lower insulating layers, and a plurality of upper insulating layers on the plurality of intermediate insulating layers;
the plurality of lower insulating layers has a hardness lower than that of the plurality of intermediate insulating layers; and
the plurality of upper insulating layers has a hardness higher than that of the plurality of intermediate insulating layers.

2. The semiconductor device of claim 1, wherein:
the hardness of the plurality of lower insulating layers is 1% to 15% lower than that of the plurality of the intermediate insulating layers; and
the hardness of the plurality of upper insulating layers is 1% to 15% higher than that of the plurality of the intermediate insulating layers.

3. The semiconductor device of claim 1, wherein each of the lower insulating layers, the intermediate insulating layers, and the upper insulating layers comprises silicon oxide.

4. The semiconductor device of claim 1, further comprising a plurality of shape control insulating layers interposed between a lower group of the intermediate insulating layers and an upper group of the intermediate insulating layers, between the plurality of intermediate insulating layers and the plurality of lower insulating layers, or between the plurality of upper insulating layers and the plurality of intermediate insulating layers,
wherein the plurality of shape control insulating layers have a hardness lower than that of the plurality of intermediate insulating layers.

5. The semiconductor device of claim 4, wherein the plurality of shape control insulating layers have a hardness lower than that of the plurality of lower insulating layers.

6. The semiconductor device of claim 4, wherein the hardness of the plurality of shape control insulating layers is 1% to 15% lower than that of the plurality of intermediate insulating layers.

7. The semiconductor device of claim 4, wherein:
the pillar has a first width in a region in which the pillar passes through the plurality of intermediate insulating layers,
the pillar has a second width in a region in which the pillar passes through the shape control insulating layers, and the second width is greater than the first width.

8. The semiconductor device of claim 4, wherein the plurality of shape control insulating layers occupies a region of the device within a range of 0.3 times to 0.7 times a height of the stacked-layer structure.

9. A semiconductor device comprising:
a substrate in a cell region and a connection region of the device;
a stacked-layer structure in the cell region and having insulating layers and gate electrodes, the insulating layers alternately stacked with the gate electrodes on the substrate;
an insulating interlayer in the connection region and covering the stacked-layer structure in the connection region;
a cell pillar passing through the stacked-layer structure in the cell region; and
a dummy pillar passing through the insulating interlayer and the stacked-layer structure in the connection region,
wherein:
the insulating layers include a plurality of lower insulating layers, a plurality of intermediate insulating layers on the plurality of lower insulating layers, and a plurality of upper insulating layers on the plurality of intermediate insulating layers;
the plurality of lower insulating layers have a hardness lower than that of the plurality of intermediate insulating layers; and
the plurality of upper insulating layers have a hardness higher than that of the plurality of intermediate insulating layers.

10. The semiconductor device of claim 9, wherein:
an upper end of the cell pillar has a first width;
the dummy pillar has a second width at substantially the same horizontal level as that where the upper end of the cell pillar has the first width; and
the first width is smaller than the second width.

11. The semiconductor device of claim 9, wherein:
a lower end of the cell pillar has a third width;
the dummy pillar has a fourth width at substantially the same horizontal level as that where the lower end of the cell pillar has the third width; and
the third width is greater than the fourth width.

12. The semiconductor device of claim 9, wherein:
an upper region of the cell pillar passes through the upper insulating layers;
an angle subtended by a side surface of the upper region of the cell pillar and a first line perpendicular to a surface of the substrate is smaller than an angle subtended by a side surface of the dummy pillar and a second line perpendicular to the surface of the substrate; and
the side surface of the upper region of the cell pillar intersects the first line at substantially the same horizontal level in the device as that at which the side surface of the dummy pillar intersects the second line.

13. The semiconductor device of claim 9, wherein:
a lower region of the cell pillar passes through the lower insulating layers;
an angle subtended by a side surface of the lower region and a first line perpendicular to a surface of the substrate is smaller than an angle subtended by a side surface of the dummy pillar and a second line perpendicular to the surface of the substrate; and
the side surface of the lower region of the cell pillar intersects the first line at substantially the same horizontal level in the device as that at which the side surface of the dummy pillar intersects the second line.

14. The semiconductor device of claim 9, further comprising a plurality of shape control insulating layers interposed between a lower group of the plurality of intermediate insulating layers and an upper group of the plurality of intermediate insulating layers, between the plurality of intermediate insulating layers and the plurality of lower insulating layers, or between the plurality of upper insulating layers and the plurality of intermediate insulating layers,
wherein the plurality of shape control insulating layers have a hardness lower than that of the plurality of intermediate insulating layers.

15. The semiconductor device of claim 14, wherein:
the cell pillar has a fifth width in a region in which the cell pillar passes through the shape control insulating layers;
the dummy pillar has a sixth width at substantially the same horizontal level as that at which the cell pillar has the fifth width; and
the fifth width is greater than the sixth width.

16. The semiconductor device of claim 9, wherein the insulating interlayer includes:
a first interlayer insulating layer having substantially the same hardness as the plurality of lower insulating layers;
a second interlayer insulating layer having substantially the same hardness as the plurality of intermediate insulating layers and disposed on the first interlayer insulating layer; and
a third interlayer insulating layer having substantially the same hardness as the plurality of upper insulating layers and disposed on the second interlayer insulating layer.

17. A semiconductor device comprising:
a substrate;
a stacked-layer structure having insulating layers and gate electrodes, the insulating layers alternately stacked with the gate electrodes on the substrate; and
a pillar passing through the stacked-layer structure,
wherein:
the insulating layers include a plurality of lower insulating layers, a plurality of shape control insulating layers on the plurality of lower insulating layers, and a plurality of upper insulating layers on the plurality of shape control insulating layers,
the plurality of shape control insulating layers have a hardness lower than that of the plurality of upper insulating layers; and
the plurality of shape control insulating layers occupies a region of the device within a range of 0.3 times to 0.7 times a height of the stacked-layer structure.

18. The semiconductor device of claim 17, wherein:
the plurality of lower insulating layers have a hardness which is lower than that of the plurality of upper insulating layers and higher than that of the plurality of shape control insulating layers; and
an upper surface of an uppermost one of the lower insulating layers is disposed at a level in a range of 0.3 times to 0.4 times a height of the stacked-layer structure.

19. The semiconductor device of claim 17, further comprising a group of intermediate insulating layers interposed between the plurality of shape control insulating layers and the plurality of upper insulating layers, wherein the group of intermediate insulating layers has a hardness lower than that of the plurality of upper insulating layers and higher than that of the plurality of lower insulating layers.

20. The semiconductor device of claim 17, wherein a bottom surface of an uppermost one of the upper insulating layers is disposed at a level in a range of 0.5 times to 0.9 times a height of the stacked-layer structure.

* * * * *